United States Patent
Yu et al.

(10) Patent No.: US 8,726,204 B2
(45) Date of Patent: *May 13, 2014

(54) MANAGING AND CONTROLLING THE USE OF HARDWARE RESOURCES ON INTEGRATED CIRCUITS

(75) Inventors: Henry Yu, Palo Alto, CA (US); Darren Zacher, Calgary (CA); Mandar Chitnis, Pleasanton, CA (US); Varad Joshi, Portland, OR (US); Anil Khanna, Beaverton, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 311 days.

This patent is subject to a terminal disclaimer.

(21) Appl. No.: 12/793,571

(22) Filed: Jun. 3, 2010

(65) Prior Publication Data

US 2010/0318954 A1    Dec. 16, 2010

Related U.S. Application Data

(63) Continuation of application No. 11/452,677, filed on Jun. 13, 2006, now Pat. No. 7,735,050.

(60) Provisional application No. 60/771,972, filed on Feb. 9, 2006.

(51) Int. Cl.
*G06F 17/50*    (2006.01)

(52) U.S. Cl.
USPC .......................................... 716/104; 716/101

(58) Field of Classification Search
USPC ................................................ 716/100–104
See application file for complete search history.

(56) References Cited

U.S. PATENT DOCUMENTS

| | | | |
|---|---|---|---|
| 3,624,616 | A | 11/1971 | Patel |
| 4,527,249 | A | 7/1985 | Van Brunt |
| 5,404,319 | A | 4/1995 | Smith et al. |
| 5,428,740 | A | 6/1995 | Wood et al. |
| 5,541,850 | A | 7/1996 | Vander Zanden et al. |

(Continued)

FOREIGN PATENT DOCUMENTS

| | | |
|---|---|---|
| EP | 0848342 | 6/1998 |
| GB | 2367225 | 3/2002 |
| JP | 5-101141 | 4/1993 |

OTHER PUBLICATIONS

U.S. Appl. No. 60/257,923, filed Dec. 21, 2000, Prakash et al.

(Continued)

*Primary Examiner* — Binh Tat
(74) *Attorney, Agent, or Firm* — Klarquist Sparkman, LLP

(57) ABSTRACT

Disclosed herein are representative embodiments of methods and apparatus for managing and allocating hardware resources during RTL synthesis. For example, in one exemplary method disclosed herein, an RTL description of a circuit to be implemented in a target architecture is received. The target architecture of this embodiment comprises a fixed number of hardware resources in a class of hardware resources. One or more operator instances are determined from the RTL description received, where at least some of the operator instances are implementable by the hardware resources in the class of hardware resources. In this embodiment, and prior to initially synthesizing the RTL description into a gate-level netlist, assignment information indicative of how the operator instances are to be implemented using the hardware resources in the class of hardware resources is automatically determined. A graphical user interface is also provided that allows a user to view and modify the assignment information.

20 Claims, 12 Drawing Sheets

(56) References Cited

U.S. PATENT DOCUMENTS

| | | | |
|---|---|---|---|
| 5,555,201 | A | 9/1996 | Dangelo et al. |
| 5,623,419 | A | 4/1997 | Kundert |
| 5,625,580 | A | 4/1997 | Read et al. |
| 5,634,115 | A | 5/1997 | Fitzpatrick et al. |
| 5,673,198 | A | 9/1997 | Lawman et al. |
| 5,727,187 | A | 3/1998 | Lemche et al. |
| 5,764,951 | A | 6/1998 | Ly et al. |
| 5,847,969 | A | 12/1998 | Miller et al. |
| 5,870,308 | A | 2/1999 | Dangelo et al. |
| 5,870,588 | A | 2/1999 | Rompaey et al. |
| 5,880,971 | A | 3/1999 | Dangelo et al. |
| 5,912,819 | A | 6/1999 | Kucukcakar et al. |
| 6,044,211 | A | 3/2000 | Jain |
| 6,053,948 | A | 4/2000 | Vaidyanathan et al. |
| 6,145,117 | A | 11/2000 | Eng |
| 6,195,786 | B1 | 2/2001 | Raghunathan et al. |
| 6,292,931 | B1* | 9/2001 | Dupenloup ............... 716/104 |
| 6,305,006 | B1 | 10/2001 | Markov |
| 6,314,552 | B1 | 11/2001 | Markov |
| 6,360,356 | B1 | 3/2002 | Eng |
| 6,467,075 | B1 | 10/2002 | Sato et al. |
| 6,477,683 | B1 | 11/2002 | Killian et al. |
| 6,477,689 | B1 | 11/2002 | Mandell et al. |
| 6,480,985 | B1 | 11/2002 | Reynolds et al. |
| 6,543,043 | B1* | 4/2003 | Wang et al. ............... 716/122 |
| 6,574,708 | B2 | 6/2003 | Hayter et al. |
| 6,587,995 | B1 | 7/2003 | Duboc et al. |
| 6,611,952 | B1 | 8/2003 | Prakash et al. |
| 6,691,301 | B2 | 2/2004 | Bowen |
| 6,701,501 | B2 | 3/2004 | Waters et al. |
| 6,704,914 | B2 | 3/2004 | Nishida et al. |
| 6,708,144 | B1 | 3/2004 | Merryman et al. |
| 6,711,729 | B1 | 3/2004 | McElvain et al. |
| 6,760,888 | B2 | 7/2004 | Wang et al. |
| 6,769,081 | B1 | 7/2004 | Parulkar |
| 6,917,909 | B1 | 7/2005 | Markov et al. |
| 6,978,430 | B2 | 12/2005 | McElvain et al. |
| 7,134,100 | B2 | 11/2006 | Ravi et al. |
| 7,275,233 | B2 | 9/2007 | McElvain et al. |
| 7,302,670 | B2 | 11/2007 | Bowyer et al. |
| 7,310,787 | B2 | 12/2007 | Prakash et al. |
| 7,735,050 | B2* | 6/2010 | Yu et al. .................. 716/104 |
| 2002/0059553 | A1* | 5/2002 | Eng .......................... 716/4 |
| 2002/0097269 | A1 | 7/2002 | Batcha et al. |
| 2002/0133788 | A1 | 9/2002 | Waters et al. |
| 2002/0194572 | A1* | 12/2002 | McElvain et al. .......... 716/1 |
| 2003/0149954 | A1* | 8/2003 | McElvain et al. .......... 716/18 |
| 2004/0111692 | A1 | 6/2004 | Bowyer et al. |
| 2004/0143801 | A1 | 7/2004 | Waters et al. |
| 2007/0186205 | A1 | 8/2007 | Yu et al. |
| 2008/0077906 | A1 | 3/2008 | Bowyer et al. |
| 2008/0172646 | A1 | 7/2008 | Prakash et al. |

OTHER PUBLICATIONS

Antao et al., "ARCHGEN: Automated Synthesis of Analog Systems," *IEEE Transactions on Very Large Scale Integration (VLSI) Systems*, pp. 231-244 (Jun. 1995).
Antao, "Architectural Exploration for Analog System Synthesis," *Proceedings of the IEEE Custom Integrated Circuits Conference*, pp. 529-532 (May 1995).
Antoniazzi et al., "A Methodology for Control-Dominated Systems CoDesign," *Third International Workshop on Hardware/Software Codesign*, pp. 2-9 (Sep. 1994).
Arnout, "SystemC Standard," *IEEE*, pp. 573-577 (2000).
Buonanno et al., "Application of a Testing Framework to VHDL Descriptions at Different Abstraction Levels," *IEEE International Conference on Computer Design: VLSI in Computers and Processors*, pp. 654-659 (Oct. 1997).
Camposano et al., "Synthesizing Circuits From Behavioral Descriptions," *IEEE Transactions on Computer-Aided Design*, vol. 8, No. 2, pp. 171-180 (Feb. 1989).
Camposano, "From Behavior to Structure: High Level Synthesis," *IEEE Design & Test of Computers*, pp. 8-19 (Oct. 1990).

Cong et al., "Combinational Logic Synthesis for LUT Based Field Programmable Gate Arrays," *ACM Transactions on Design Automation of Electronic Systems*, vol. 1, No. 2, pp. 145-204 (Apr. 1996).
Cong et al., "FlowMap: An Optimal Technology Mapping Algorithm for Delay Optimization in Lookup-Table Based FPGA Designs," *IEEE Transactions on Computer-Aided Design of Integrated Circuits and Systems*, vol. 13, No. 1, pp. 1-12 (Jan. 1994).
De Micheli et al., "The Olympus Synthesis System," *IEEE Design & Test of Computers*, pp. 37-53 (Oct. 1990).
Elliott, *Understanding Behavioral Synthesis: A Practical Guide to High-Level Design*, Ch. 2, pp. 5-23, and Ch. 9, pp. 155-172, Kluwer Academic Publishers (1999).
Francis et al., "Chortle-crf: Fast Technology Mapping for Lookup Table-Based FPGAs," *Proceedings of the 28th ACM/IEEE Design Automation Conference*, pp. 227-233 (1991).
Fuhrman, "Industrial Extensions to University High Level Synthesis Tools: Making it Work in the Real World," *Proceedings of the 28th Conference on ACM/IEEE Design Automation Conference*, pp. 520-525 (Jun. 1991).
Goering, "Cadence Mounts Synthesis Threat," Electronic Engineering Times, 3 pp., downloaded from http://eetimes.com/news/97/939news/threat.html (1997).
Goldberg, "Visual Architect Bridges the Gap Between Systems and ASIC Designers," 4 pp. downloaded from http://www.edacafe.com/technical/papers/Cadence/archive/vol2No2/visualArc.php (Sep. 4, 2006).
Hsu et al., "Digital Design From Concept to Prototype in Hours," *IEEE Asia-Pacific Conference on Circuits and Systems*, pp. 175-181 (Dec. 1994).
"Innovations in Behavioral Design and Synthesis," downloaded from http://cynapps.com, 2 pp. (Jun. 6, 2003).
Jemai et al., "Architectural Simulation in the Context of Behavioral Synthesis," *Proc. Design Automation and Test in Europe*, pp. 590-595 (Feb. 1998).
Kim et al., "Utilization of Multiport Memories in Data Path Synthesis," *Proceedings of the 30th ACM/IEEE Design Automation Conference*, pp. 298-302 (1993).
Kucukcakar et al., "Matisse: An Architectural Design Tool for Commodity ICs," *IEEE Design & Test of Computers*, vol. 15, Issue 2, pp. 22-33 (Apr.-Jun. 1998).
Liao et al., "An Efficient Implementation of Reactivity for Modeling Hardware in the Scenic Design Environment," *Proceedings of the 34th ACM/IEEE Design Automation Conference*, pp. 70-75 (1997).
Lipton et al., "PDL++: An Optimizing Generator Language for Register Transfer Design," *ISCAS-90*, pp. 1135-1138 (1990).
Ly et al., "Applying Simulated Evolution to High Level Synthesis," *IEEE Transactions on Computer-Aided Design of Integrated Circuits and Systems*, pp. 389-409 (Mar. 1993).
Ly et al., "Scheduling using Behavioral Templates," *Proceedings of the 32nd ACM/IEEE Design Automation Conference*, pp. 101-106 (Jun. 1995).
Marwedel et al., "RAM-Based Architectural Logic and Architecture Synthesis," in *Novel Approaches in Logic and Architecture Synthesis*, pp. 233-244, G. Saucier, Ed. (1995).
McFarland et al., "The High-Level Synthesis of Digital Systems," *Proceedings of the IEEE*, vol. 78, No. 2, pp. 301-318 (Feb. 1990).
Mentor Graphics Corporation, "LeonardoSpectrum Reference Manual," pp. i-xiv, 1-1 to 2-18 (2004).
Mentor Graphics Corporation, "Precision RTL Synthesis Reference Manual," pp. i-xv, 1-1 to 2-20, 6-1 to 9-46 (2004).
Mentor Graphics Corporation, "Precision™ Synthesis Reference Manual," pp. i-x, 1-1 to 2-18, 4-1 to 7-12 (2003).
Middelhoek et al., "From VHDL to Efficient and First-Time-Right Designs: A Formal Approach," *ACM Transactions on Design Automation of Electronic Systems*, vol. 1, No. 2, pp. 205-250 (Apr. 1996).
Park et al., "Sehwa: A Software Package for Synthesis of Pipelines from Behavioral Specifications," *IEEE Transactions on Computer-Aided Design of Integrated Circuits and Systems*, pp. 356-370 (Mar. 1988).
Patel, "A Design Representation for High Level Synthesis," *Proceedings of the European Design Automation Conference*, pp. 374-379 (Mar. 1990).

(56) References Cited

OTHER PUBLICATIONS

Perkowski et al., "Diades, A High Level Synthesis System," *IEEE International Symposium on Circuits and Systems*, pp. 1895-1898 (May 1989).

Prakash et al., "Techniques for Rapid Implementation of High-Performance FPGAs from Algorithmic C Specification," *HDLCon 2001 Technical Program*, 9 pp. (Feb. 28, 2001).

Ramachandran et al., "An Algorithm for Array Variable Clustering," *Proceedings of the 5th ACM/IEEE European Design and Test Conference*, pp. 262-266 (1994).

Ravikumar et al., "Synthesis of Testable RTL Designs," *Eleventh International Conference on VLSI Design: VLSI for Signal Processing, IEEE*, pp. 187-192, (Jan. 4-7, 1998).

Schmit et al., "Synthesis of Application-Specific Memory Designs," *IEEE Transactions on Very Large Scale Integration (VLSI) Systems*, vol. 5, No. 1, pp. 101-111 (1997).

Schneider, "A Methodology for Hardware Architecture Trade-off at Different Levels of Abstraction," *European Design and Test Conference*, pp. 537-541 (Mar. 1997).

Séméria et al., "Methodology for Hardware/Software Co-verification in C/C++," *Proceedings of the IEEE International High Level Design Validation and Test Workshop HLDVT'99*, 4 pp. (Nov. 1999).

Shirai, "A Design System for Special Purpose Processors Based on Architectures for Distributed Processing," *Proceedings of the Design Automation Conference*, pp. 380-385 (Sep. 1995).

Synplicity, Inc., "Synplify Pro Reference Manual," pp. i-xxviii, 3-1 to 3-106, 8-1 to 8-212, A-1 to H-64 (Jun. 2003).

Tanir et al., "A Specification Driven Architectural Design Environment," *Computer*, pp. 26-35 (Jun. 1995).

Thomas, "The System Architect's Workbench," *Proceedings of the 25th Design Automation Conference*, pp. 337-343 (Jun. 1988).

Walker et al., "Behavioral Transformation for Algorithmic Level IC Design," *IEEE Transactions on Computer-Aided Design of Integrated Circuits and Systems*, pp. 1115-1128 (Oct. 1989).

Walker et al., "Increasing User Interaction During High Level Synthesis," *Proceedings of the 24th Annual International Symposium in Microarchitecture*, pp. 133-142 (Nov. 1991).

Wolf, "Object-Oriented Co-Synthesis of Distributed Embedded Systems," *TODAES*, vol. 1, No. 3, pp. 301-314 (1996).

Zhu et al., "Syntax and Semantics of the SpecC+ Language," Technical Report ICS-97-16, pp. 1-12 (Apr. 1997).

Zivojnovic et al., "LISA—Machine Description Language and Generic Machine Model for HW/SW Co-Design," *IEEE Workshop on VLSI Signal Processing*, pp. 127-136 (Oct. 1996).

\* cited by examiner

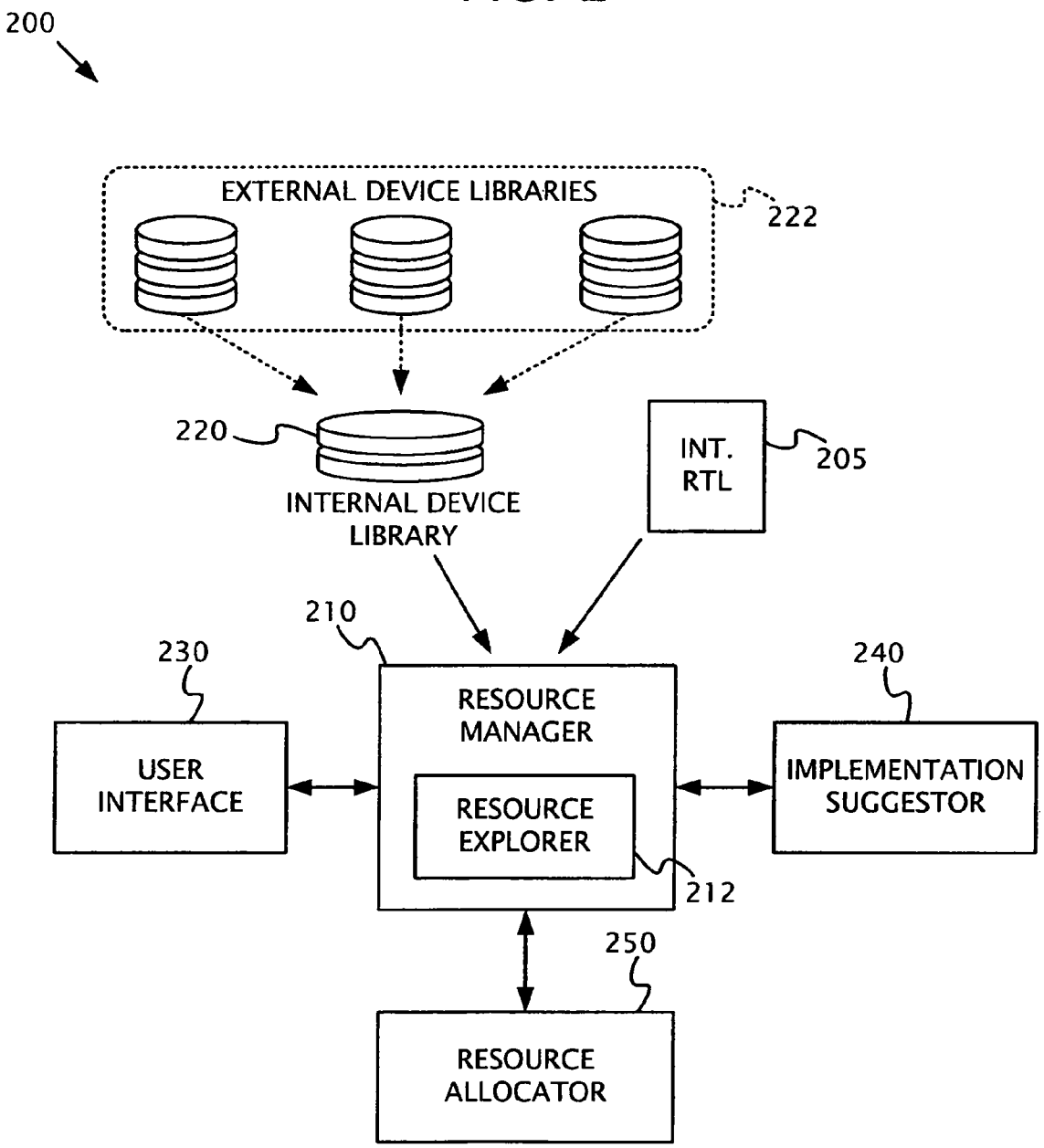

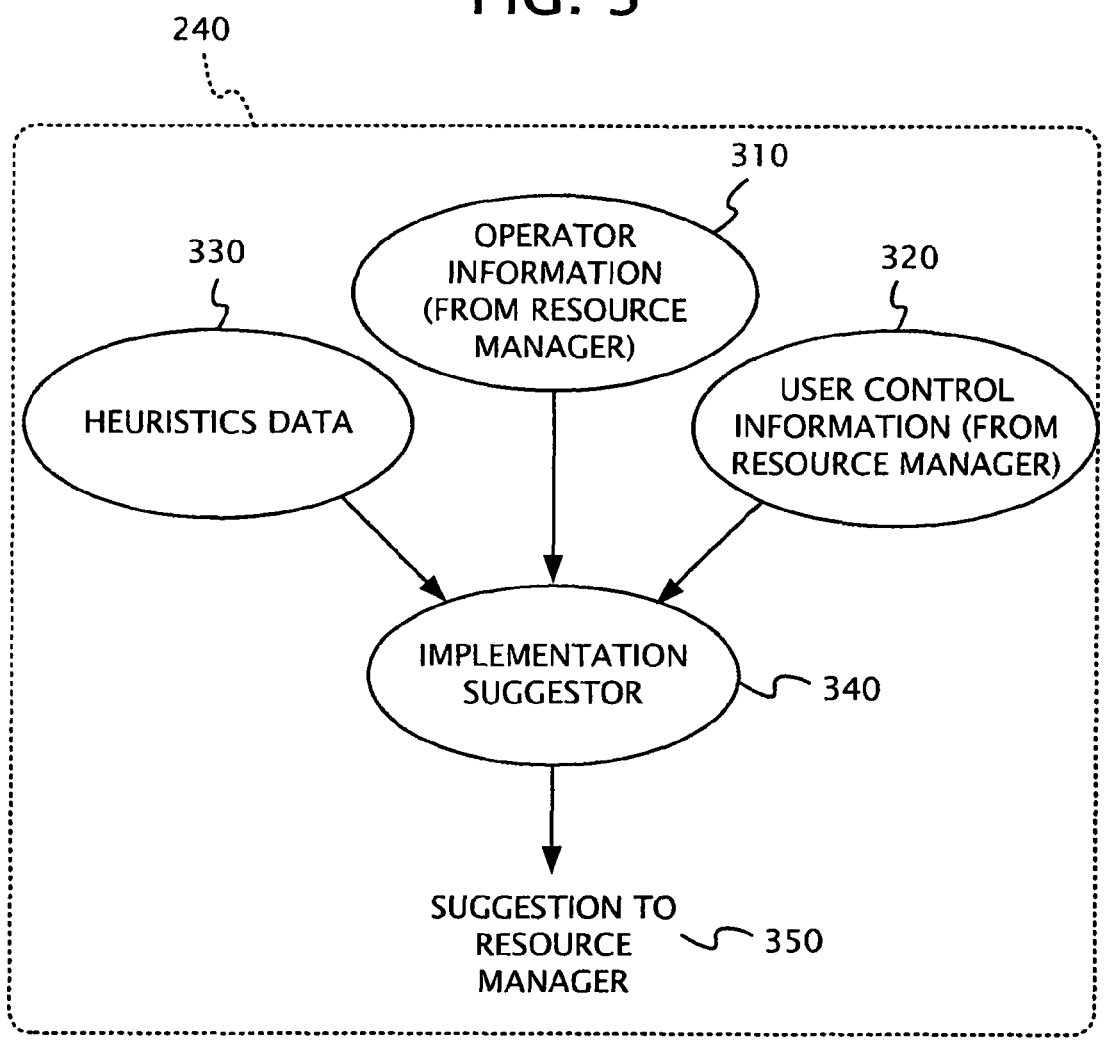

MANAGING AND CONTROLLING THE USE OF HARDWARE RESOURCES ON INTEGRATED CIRCUITS

CROSS REFERENCE TO RELATED APPLICATIONS

This application is a continuation of U.S. patent application Ser. No. 11/452,677, filed Jun. 13, 2006, which claims the benefit of U.S. Provisional Patent Application No. 60/771,972, filed Feb. 9, 2006, both of which are incorporated herein by reference.

FIELD

This application relates generally to the field of RTL synthesis, and specifically to the field of RTL synthesis for field programmable gate arrays.

BACKGROUND

The area of field programmable gate array ("FPGA") design is evolving at a rapid pace. The increase in the complexity of FPGA architectures means that programmable logic can now be used in far more applications than ever before. For example, newer FPGAs are steering away from the traditional "logic-only" architecture to architectures that use embedded dedicated blocks for specialized applications.

In the early days of programmable logic design, designers generally tended to choose a part based on the pin count and logic gate availability. If a design would not fit or meet timing, they would invariably choose a bigger part or a faster speed grade, since the early FPGAs were similar to each other in their basic architecture (usually an array of blocks that consisted of configurable logic and registers). The performance of a particular application was usually dependent on the flexibility of this block and of the routing resources available.

Programmable logic devices are now increasingly differentiated based on the various specialized blocks and the functionality they offer. Some of the more common features that are available are, for example: embedded DSP blocks, embedded memory blocks, efficient shift registers, and other such specialized components. Although the architecture of each FPGA family is unique and vendor specific, the basic combination of the functional blocks remains essentially the same: configurable combinatorial logic (for example, look-up tables ("LUTs"), logic elements ("LEs"), combinatorial cells ("C-cells"), and the like) plus registers and perhaps high-speed carry chain circuitry.

To account for the increased number of specialized blocks while still allowing a designer sufficient flexibility to consider various FPGA target architectures supplied from a wide variety of vendors, improved synthesis tool for implementing a design in a particular FPGA architecture are desired. In particular, improved RTL synthesis tools, which generate a gate-level netlist from a register-level circuit description (for example, from a register-transfer-level ("RTL") description) are desired.

In order to address the challenge of trying to improve the quality of results when implementing a design in a particular FPGA target architecture, it is desirable for a designer to explore various possible FPGA implementations across a multitude of potential FPGA target architectures during the RTL synthesis process. Because RTL synthesis tool are typically bundled with a particular FPGA vendor's postsynthesis tools, RTL synthesis tools are typically constrained to that vendor's particular architecture. Therefore, it is also desirable to provide a vendor-independent FPGA synthesis environment. Furthermore, most RTL synthesis tools automatically choose how RTL operator instances are to be implemented in a particular FPGA architecture, offering the user little (if any) ability to influence the process. While a user can, in some instances, modify the RTL prior to RTL synthesis to affect such implementation decisions, the procedure of doing so is time-consuming and prone to user error. Accordingly, it is further desirable to provide an RTL synthesis tool that allows the designer to more easily assign RTL operator instances to use particular hardware resources on an FPGA target architecture and/or more easily influence the automated implementation performed by the synthesis tool. Moreover, it is desirable to quickly estimate the performance of a user's design choices and to report the impact of the design choices on the overall performance of the particular FPGA architecture being considered, including resource usage.

SUMMARY

Disclosed herein are representative embodiments of methods and apparatus for managing and controlling the use of hardware resources during RTL synthesis. The disclosed methods and apparatus should not be construed as limiting in any way. Instead, the present disclosure is directed toward all novel and nonobvious features and aspects of the various disclosed embodiments, alone and in various combinations and subcombinations with one another. The methods and apparatus are not limited to any specific aspect or feature or combinations thereof, nor do the disclosed methods require that any one or more specific advantages be present or problems be solved.

In one exemplary embodiment, a method for performing RTL synthesis in a computer-implemented synthesis tool is disclosed. In this embodiment, a register-transfer-level ("RTL") description of a circuit to be implemented in a target architecture is received. The target architecture of this embodiment has a limited number of hardware resources available in a class of hardware resources. For example, the target architecture can comprise one or more field programmable gate arrays ("FPGAs"). Furthermore, the class of hardware resources can comprise embedded memory blocks, embedded multiplier blocks, embedded DSP blocks, or logic fabric. In this embodiment, assignment information indicative of how operator instances in the RTL description are to be implemented using the hardware resources in the class of hardware resources is determined. Furthermore, one or more of the following are displayed to the user prior to a gate-level netlist being generated according to the assignment information: (a) a total number of hardware resources available in the target architecture in the class of hardware resources; (b) a total number of hardware resources in the class that have been assigned using a user-selected implementation constraint; (c) a total number of hardware resources in the class that have been assigned without using a user-selected implementation constraint; or (d) a total number of hardware resources in the class that are remaining after accounting for current assignments. In certain implementations, the class of hardware resources is a first class of hardware resources, and the assignment information is modified such that at least one of the operator instances is to be implemented using hardware resources in a second class of hardware resources. The number of hardware resources in the first class of hardware resources that have been assigned after the modification can then be calculated, and an updated indication of the total number of hardware resources in the first class that are remaining after accounting for current assignments can be displayed. The modification to the assignment information can be performed, for example, in accordance with an implementation constraint selected by the user. In some implementations, an indication that the hardware resources in the class of hardware resources have been overmapped can be displayed.

In another disclosed embodiment, another method for performing RTL synthesis in a computer-implemented synthesis tool is disclosed. In this embodiment, an RTL description of a circuit to be implemented in a target architecture is received. The target architecture of this embodiment comprises a fixed number of available hardware resources in a class of hardware resources. For example, the target architecture can comprise one or more FPGAs. In this embodiment, one or more operator instances are determined from the RTL description received, where at least some of the operator instances are implementable by the hardware resources in the class of hardware resources. An indication of the operator instances implementable by the hardware resources in the class of hardware resources are displayed to the user. This indication can be provided, in some implementations, prior to initially synthesizing the RTL description into a gate-level netlist. An indication of the number of the hardware resources available in the class of hardware resources can also be displayed to the user. In certain implementations, at least one of the operator instances can be assigned to be implemented using at least one of the hardware resources in the class of hardware resources. The number of the hardware resources that have been assigned can then be calculated, and an indication of the number of the hardware resources assigned displayed. In some cases, the assignment can be performed in accordance with an implementation constraint selected by the user. In certain implementations, an indication that the hardware resources have been overmapped can be displayed. Furthermore, an indication of a number of the hardware resources in the class of hardware resources to which operator instances have not been assigned can also be displayed.

In another exemplary embodiment, another method for performing synthesis in an RTL synthesis tool is disclosed. In this exemplary embodiment, a description of a circuit to be implemented in a target architecture (for example, one or more FPGAs) is received. The description can be an RTL description or gate-level netlist including one or more preserved operators. A plurality of operator instances implementable by one or more hardware resources available in the target architecture are determined from the description received. A graphical user interface is provided that displays to a user one or more of the operator instances and also allows the user to associate an implementation constraint with at least one of the operator instances. In this embodiment, the implementation constraint is selectable from a list of one or more implementation constraints known to be usable for the associated operator instance(s). Furthermore, the implementation constraint can indicate that an associated operator instance is to be implemented in the target architecture using one of a set of one or more implementation methods, where the set of one or more implementation methods consists of a subset of all implementation methods available for implementing the associated operator instance in the target architecture. A gate-level netlist can be produced implementing operator instances in accordance with any associated implementation constraints. In some implementations, the graphical user interface also displays an associated timing delay or resource usage cost for the implementation constraint. In some implementations, the operator instances are assigned to respective hardware resources available in the target architecture, and information about resource usage in the target architecture resulting from the assignment is displayed to the user via the graphical user interface. In these implementations, the information is displayed before a gate-level netlist is generated from the assignment. The information about resource usage can include one or more of the following: (a) a total number of hardware resources available in the target architecture in a class of hardware resources; (b) a total number of hardware resources in the class that have been assigned using a user-selected implementation constraint; (c) a total number of hardware resources in the class that have been assigned without using a user-selected implementation constraint; or (d) a total number resources in the class that are remaining after accounting for the assignment. The information about resource usage can also include a total number of hardware resources in a class of hardware resources made unavailable for assignment.

In another exemplary embodiment, another method for performing synthesis in an RTL synthesis tool is disclosed. In this exemplary embodiment, an RTL description of a circuit to be implemented in a target architecture is received. The target architecture of this embodiment comprises a fixed number of hardware resources in a class of hardware resources. For example, the target architecture can comprise one or more FPGAs. One or more operator instances are determined from the RTL description received, where at least some of the operator instances are implementable by the hardware resources in the class of hardware resources. In this embodiment, and prior to initially synthesizing the RTL description into a gate-level netlist, assignment information indicative of how the operator instances are to be implemented using the hardware resources in the class of hardware resources is automatically determined. A graphical user interface is also provided that allows a user to view and modify the assignment information. One or more of the following can be displayed in the graphical user interface: (a) a total number of hardware resources available in the target architecture in the class of hardware resources; (b) a total number of hardware resources in the class that have been assigned using a user-selected implementation constraint; (c) a total number of hardware resources in the class that have been automatically assigned without using a user-selected implementation constraint; or (d) a total number resources in the class that are remaining after accounting for the assignment information.

Another disclosed embodiment is an RTL synthesis system. In this embodiment, the system includes a database comprising data indicative of available hardware resources in one or more types of FPGAs, memory storing an RTL description of a circuit to be implemented in a selected one of the FPGAs, and a graphical user interface. The graphical user interface of this embodiment allows a user to view how one or more operator instances defined by the RTL description are assigned to be implemented by the available hardware resources of the selected one of the FPGAs and displays to the user how many of the available hardware resources in the selected one of the FPGAs remain available after accounting for the assignments. This information can be displayed, for example, prior to synthesis of the RTL description into a gate-level netlist. In some implementations, the RTL synthesis system further comprises an implementation suggestor component that automatically assigns operator instances to the available hardware resources. The assignments made by the implementation suggestor component can be based at least in part on heuristics developed from benchmarking experiments with the selected one of the FPGAs. The graphical user interface can also allow a user to associate an implementation constraint with one or more respective operator instances defined by the RTL description, and the implementation suggestor component can assign one or more operator instances to corresponding hardware resources in accordance with the respective implementation constraints. Furthermore, the graphical user interface can allow the user to modify how at least some of the operators are allocated to the available hardware resources and update the display of how many of the available hardware resources remain available to account for the modification. In some implementations, the graphical user interface allows the user to set a budget for a class of hardware resources that limits how many hardware resources in the class of hardware resources can be assigned to implement the one or more operator instances defined by the RTL description.

Any of the disclosed methods may be performed by a computer program, such as an electronic-design-automation ("EDA") software tool comprising computer-executable instructions stored on one or more computer-readable media. Further, any of the disclosed methods can be used to create circuit design information stored on one or more computer-readable media. The circuit design information can comprise, for example, a gate-level netlist or circuit design database or data structure that reflects the resource assignments made during RTL synthesis and may be created or modified on a single computer or via a network.

The foregoing and other objects, features, and advantages of the disclosed technology will become more apparent from the following detailed description, which proceeds with reference to the accompanying figures.

BRIEF DESCRIPTION OF DRAWINGS

FIG. 2 is a schematic block diagram show an exemplary resource management framework that can be used to perform the implementer assignment process in FIG. 1.

FIG. 3 is a schematic block diagram of the components of the implementation suggestor component in the exemplary resource management framework of FIG. 2.

DETAILED DESCRIPTION

I. General Considerations

Figure 1:
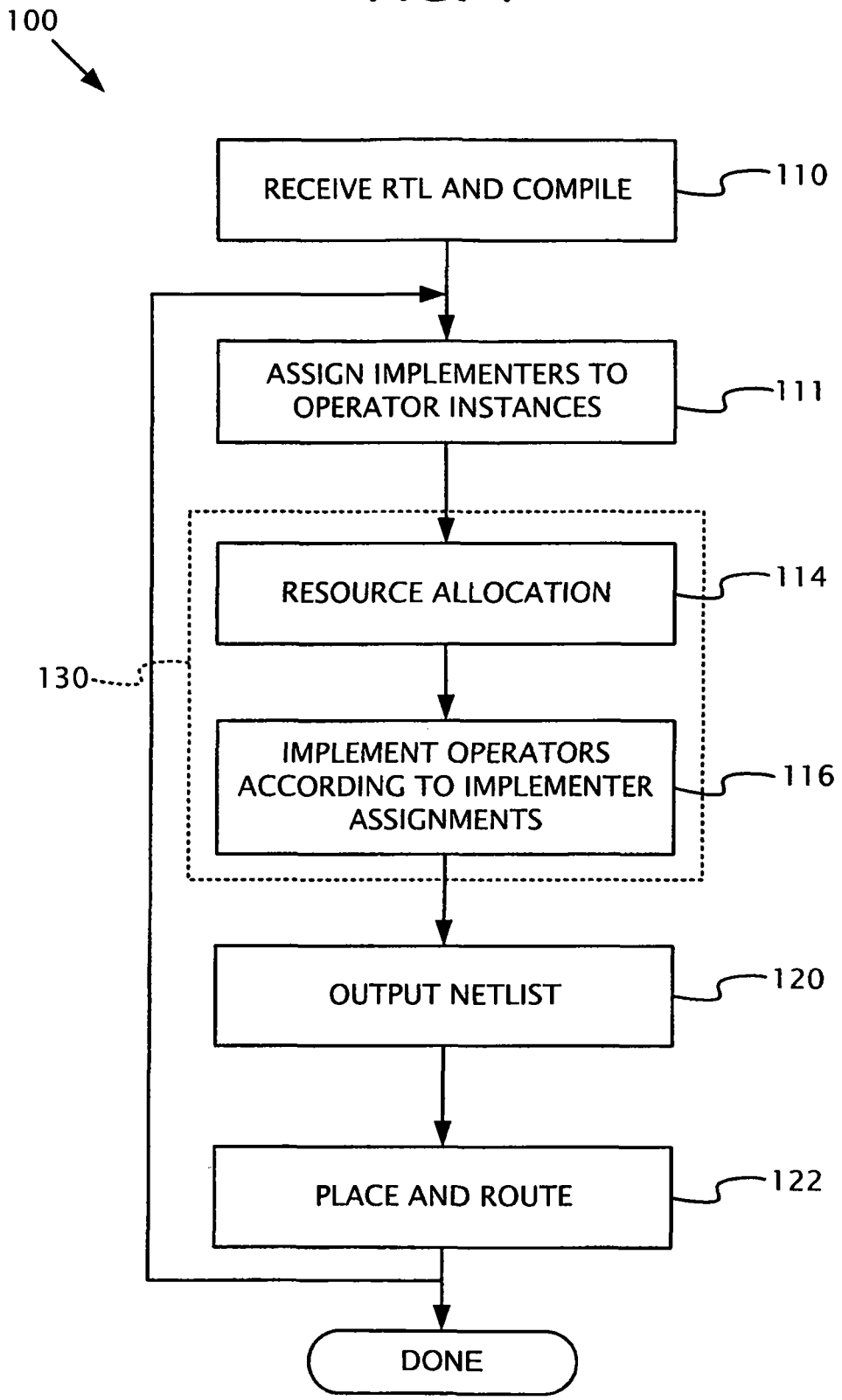
FIG. 1 is a flowchart of an exemplary RTL synthesis flow according to exemplary embodiments of the disclosed technology.

Disclosed below are representative embodiments of methods and apparatus for managing and controlling the use of hardware resources during RTL synthesis. The disclosed methods and apparatus should not be construed as limiting in any way. Instead, the present disclosure is directed toward all novel and nonobvious features and aspects of the various disclosed embodiments, alone and in various combinations and subcombinations with one another. The methods and apparatus are not limited to any specific aspect or feature or combinations thereof, nor do the disclosed methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "decide" and "provide" to describe the disclosed methods. These terms are high-level abstractions of the actual operations that are performed. The actual operations that correspond to these terms will vary depending on the particular implementation and are readily discernible by one of ordinary skill in the art.

The disclosed technology can be applied during synthesis of an integrated circuit design (for example, register-transfer-level ("RTL") synthesis of an RTL circuit description into a gate-level netlist for implementation on a field-programmable gate array ("FPGA")). Embodiments of the disclosed technology, for example, enable a user to control and manage the use of the available hardware resources on one or more selected FPGA target architectures.

This particular synthesis flow should not be construed as limiting, however, as various aspects of the technology can be used during the design and implementation of other integrated circuits (for example, application-specific integrated circuits ("ASIC"), other programmable logic devices ("PLDs"), systems-on-a-chip ("SoCs"), or microprocessors).

Any of the disclosed methods can be performed using software stored on one or more computer-readable media and executed on a computer. Such software can comprise, for example, an electronic-design-automation ("EDA") software tool used, for instance, for or in connection with RTL synthesis. Such software can be executed on a single computer or on a networked computer (for example, via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For this same reason, computer hardware that can be used to execute the computer-readable instructions is not described in further detail.

Any of the disclosed methods can also be used to modify or create a circuit represented as circuit design information stored on one or more computer-readable media. The circuit design information can comprise, for example, one or more design files or data structures (for example, a gate-level netlist or the like) and may be created or modified on a single computer or via a network.

II. Introduction to Disclosed Technology

Certain embodiments of the disclosed technology provide a synthesis environment that enables the control, management, and reporting of embedded hardware resource usage on IC devices, such as FPGAs, throughout the synthesis process. Furthermore, certain embodiments of the disclosed technology include software components (typically implemented as software modules) that enable a user to manage or that automatically manage at least in part how operator instances extracted from RTL source code are to be implemented in a target architecture. Embodiments of the disclosed technology allow a user to quickly view a potential implementation's impact on resource usage as well other circuit metrics (for example, timing and power consumption) prior to actually producing a gate-level netlist. Additionally, embodiments of the disclosed technology help facilitate complex flows, such as team design, multi-chip design, and technology partitioning through resource budgeting.

In one particular embodiment, a user interface (or API) is provided that allows the user to observe for a design a summary of resources used and available. In certain implementations, the user interface provides other circuit metrics (timing and power consumption). The user interface can also show the relevant operator instances from the RTL, their assigned implementation methods, associated resource usage, and impact on overall circuit metrics. Such views can help provide the user with multiple contexts in which to manage and control the RTL synthesis process.

The user can exercise control via the user interface (or API) in a variety of different manners. For example, the user can perform one or more of the following: specify or influence which implementation method (sometimes referred to as an "implementer") to use on an operator instance, constrain available resource usage within a budget, or set other constraints that influence the implementation process.

To foster experimentation, embodiments of the disclosed technology enable evaluation of an arbitrarily large number of implementation choices before committing to them. For example, and according to one exemplary embodiment, instances are initially unimplemented and the disclosed synthesis tool provides an initial indication of which implementation method to use for each instance, yielding an initial measurement of resource usage and overall circuit metrics. In this exemplary embodiment, as the flow proceeds, operator instances can be committed to other implementation methods by the user setting implementation constraints. Information about resource usage can be continuously (or substantially continuously) displayed to the user as modifications are made to the initial set of operator instance assignments. After a set of operator instance assignments is determined, a gate-level netlist can be generated and, if necessary, the flow can be reentered and the assignments modified again, thereby allowing the choice of assigned implementation methods to be further refined.

III. Exemplary Synthesis Flows According to the Disclosed Technology

FIG. 1 is a flowchart 100 schematically illustrating an exemplary synthesis flow according to the disclosed technology. The exemplary flow shown in FIG. 1 should not be construed as limiting in any way. For example, in other embodiments of the disclosed technology, only a subset of the illustrated method acts are performed. In still other embodiments, any of the method acts are performed alone or in other combinations and subcombinations with one another or with other synthesis acts.

At process block 110, an RTL description of a circuit design is received and one or more compiling procedures are performed. For example, in certain embodiments, this method act comprises loading device resource information about a target architecture from an internal device library, analyzing the RTL source code for syntactical or semantic errors, and elaborating the RTL description into a set of basic logic primitives. For example, arithmetic or datapath operator instances in the RTL are typically determined (through direct identification or inferential techniques) during this method act. The operator instances extracted correspond to operations in the RTL that are to be performed by one or more hardware resources, such as adders, multiplexers, memories, and so on. In some implementations, more advanced transformations can also be performed to obtain even higher-level operators. For instance, a multiply operation followed by an add operation can be combined to a single higher-level multiply-add operator, which might have a more efficient implementation than the two lower-level discrete operator implementations. It should be noted that the RTL description received can include, in some instances, pre-assigned indications (also referred to as "hints" or "implementation constraints") as to how a particular operator should be implemented in the target architecture. For example, pragmas or attributes can be used to indicate such implementation constraints. For purposes of this disclosure, the output from this method act is referred to as the "intermediate RTL description."

At process block 111, implementation methods and/or implementation constraints are assigned for the operator instances in the intermediate RTL description. For example, assignments can be made using the resource management framework described below with respect to FIG. 2.

Process blocks 114 and 116 correspond to synthesis acts performed during synthesis 130. Note that prior to synthesis 130, a variety of presynthesis acts known in the art may be performed. For example, various optimizations of the intermediate RTL may be performed. Similarly, a variety of postsynthesis acts can be performed after synthesis 130. For example, random logic mapping, constraint-driven optimization, and final design rule checking can be performed.

At process block 114, resource allocation is performed. During resource allocation, a determination can be made as to whether a resource in a class of resource is overmapped. If so, a subset of the operator instances can be automatically remapped to use a different type of available hardware resource in the target architecture, thereby allowing the design to be implemented in the target architecture. Resource allocation is typically performed obeying user supplied implementation constraints and/or other heuristics.

At process block 116, the operators in the intermediate RTL description are implemented as assigned. More particularly, the specific hardware resources that are to be used to implement the operator instances defined by the RTL are finally determined (this process is sometimes referred to as "modgen resolution").

At process block 120, the netlist from RTL synthesis is output. The gate-level netlist is typically vendor specific at this point, as the acts of resource assignment, allocation, and implementation performed at process blocks 111, 114 and 116 relate to a specific FPGA target architecture. The netlist output can subsequently be received at process block 122 by a place-and-route tool (typically a vendor specific place-and-route tool) and packed, placed, and routed. A binary configuration file that can be used to program the target architecture can be produced in the place-and-route tool (potentially after one or more additional translation steps). In certain embodiments, the area and timing of the placed-and-routed design can be analyzed and, as shown in FIG. 1, the synthesis process 100 can be reentered to modify the implementation.

IV. Exemplary Environments for Performing Resource Management

A. General Considerations

In this section, exemplary resource management frameworks are described that can be used, for example, to assign implementation methods at process block 111 above. In general, the exemplary frameworks described enable a user to identify and use desirable implementation methods for respective operator instances in the intermediate RTL description.

For any given arithmetic or datapath operator, a number of different implementation methods are typically available. For instance, a multiply-by-constant can be implemented in an FPGA target architecture as a full multiplier in general logic fabric, as a series of shift-add operations in general logic fabric, or even in the carry chain. Alternatively, an embedded memory block can be configured as a ROM to behave like a multiply-by-constant. Lastly, a dedicated DSP block could also be used. Other situations involving multiple implementation methods are well known and need not be described exhaustively here.

Given the choice of a number of different operator implementation methods, the goal of the implementer assignment procedure at process block 111 is to identify and use an implementation method that satisfies any design constraints (which can be selected by the user and typically depend on the design and application for which the design is being implemented). The design constraints can include, for example one or more of the following: resource (area) budget, power budget, and timing constraints. In addition to design constraints, often times there are architectural subtleties, requirements, and guidelines that can affect the implementation choice. These may include, for example, one or more of the following: operator size, routing, packing, or available resource limitations. These limitations can prevent an operator instance from being implemented in a certain resource. For example, an extracted memory operator instance might be too large to implement in a single embedded memory block for a given device. Hence, the operator instance should be implemented in the logic fabric, or in a combination of several embedded memory blocks, or both. The success of the mapping approach usually depends upon identifying and characterizing how each implementation choice affects the overall quality of results for the given target technology.

The description of the resource allocation framework below makes reference to "implementation methods," (also referred to as "implementers"), "implementation constraints" (also referred to as "implementation hints"), and "implementer matching." Before proceeding with a discussion of the exemplary embodiments of the resource management framework, these terms are more thoroughly discussed.

An "implementation method" or "implementer" refers to a method for implementing an operator instance in a specific way (for example, as a Brent Krung adder or as a carry look-ahead adder). A wide variety of implementation methods exist for implementing operators with hardware resources available on the FPGA target architectures. Some implementation methods are specific for a technology and/or device family, whereas others are more generic. An implementation method as used in embodiments of the disclosed technology typically includes information about which operator instances it can be applied to and includes information about what hardware resources are necessary to implement.

An "implementation constraint" or "implementation hint" is a piece of information that can be associated with an operator instance. It can be used by embodiments of the disclosed framework, for example, to help decide which implementation method should be used for that particular instance. The implementation constraint can be supplied by the user (for example, via a user interface as described below or added directly to the RTL description prior to RTL synthesis). The implementation constraint can also be supplied internally by the framework (for example, the result of using a predetermined algorithm or heuristic for assigning implementers). In certain desirable embodiments, the information provided as the implementation constraint has different levels of specificity. That is, the information can provide more generic or more precise guidance about how an operator should be implemented. For example, according to one exemplary embodiment, the implementation guidance supplied in an implementation constraint corresponds to one of multiple levels of implementation specificity.

In one particular embodiment, the levels of specificity available for an implementation constraint comprise (from least specific to most specific): a resource class, an implementation style, and a specific operator implementer. In particular implementations, for example, information at the "resource class" level indicates what class or type of physical resource in the target architecture should be used to implement an operator, but does not specify exactly how the operator should be implemented using the resource. Thus, the implementation constraint at this level narrows the number of implementation methods to use to a subset of all available methods for the target architecture (or among multiple target architectures), but does not require a single particular implementation method to be used. In one particular implementation, the available resource classes at this level include: embedded DSPs, embedded multiplier blocks (BlockMult), embedded memory blocks (BlockMem), and logic (which typically includes LUTs and registers in the target architecture). In other embodiments, other combinations of available resource classes are included at this level. Because this level of specificity is generic to most FPGAs, it is target architecture independent and, in certain embodiments, can be transferred from one target architecture to another as the different potential architectures (for example, potentially from different vendors) are explored by a user. Another type of implementation constraint at this high level is a constraint that disallows implementation in a particular resource. Thus, the constraint prevents implementation in a particular (possibly scarce or undesirable) hardware resource.

In this exemplary implementation, information at the "implementation style" level indicates not only what resource class should be used but also some additional information that further narrows the choice of which implementer to use. For example, an implementation constraint at this level might indicate to not only use the logic fabric of the target architecture to implement a resource, but also to more specifically use a Carry Chain.

Finally, in this exemplary implementation, information at the "specific operator implementer" level is the most specific matching information that can be provided, as it identifies the specific implementer to use. For example, the implementation constraint at this level might indicate to use a LUT with carry chains in a specific target architecture.

The term "matching" refers to the process of taking an implementation constraint associated with an operator instance, which typically narrows the choice of implementers to a set of one or more implementers consisting of fewer implementers than are available for the operator, and narrowing it down to a single implementer. In the exemplary framework described below, this act is typically performed by the implementation suggestor with the aid of heuristics data. The process of matching the operator with a single implementer in accordance with the implementation constraint may vary on a variety of factors (for example, when the match is performed, the desired performance characteristics of the implemented design (which can be selected by the user), or a resource budget provided by a user). According to one exemplary embodiment, the implementer resulting in the best quality of result is automatically selected at the beginning of the flow (measured, for example, according to either FPGA speed or size). Once an estimation of hardware resource usage is performed according to this first implementation, modifications can be made.

B. Exemplary Resource Management Frameworks

An exemplary framework of components for performing the overall task of managing and controlling the use of resources according to the disclosed technology is illustrated in FIG. 2. The illustrated components can consist of one or more software modules configured to interact and exchange information among each other as indicated.

In particular, FIG. 2 shows a resource manager 210 that serves as the central component of the exemplary framework. In general, the resource manager 210 receives the intermediate RTL description 205 after operator instances are determined at method act 110 and manages the relevant operator instances in the intermediate RTL description, their implementation constraints and currently assigned implementation method, and/or characteristic specifications, if any. The resource manager 210 can also track the resources available and used on the device, which can be artificially constrained with a budget. For example, in certain embodiments, the resource manager 210 includes (or otherwise interacts with) a resource explorer component 212 that provides the ability to evaluate any arbitrary set of proposed assignments before committing to them.

During the implementer assignment process, and according to one exemplary embodiment, the resource manager 210 receives information about the target architecture being considered from an internal device library 220. The internal device library 220 of this embodiment comprises one or more databases or data structures containing information about one or more target FPGA architectures. For example, the internal device library 220 can comprise information about what types of resources are available for a particular target architecture and how many of such resources are available on the target architecture. The internal device library 220 is typically created using information about a device received from a device vendor's external device library 222. The internal device libraries 220 can be updated periodically to enable synthesis on new target architectures as they become available to the public. Furthermore, the internal device libraries 220 can be centrally maintained by the EDA vendor providing the RTL synthesis tool according to the disclosed technology and accessed over a network (for example, the Internet) when a user is using the synthesis tool.

In the illustrated embodiment, the resource manager 210 interacts with a user interface 230. In exemplary embodiments, the user interface 230 comprises a set of GUI widgets, commands, and/or APIs that provide the user with multiple contexts in which to manage, control, and visualize information related to implementer constraints, implementer assignments and resource usage (and possibly to other circuit metrics (for example, timing and area)). Exemplary implementations of the user interface 230 are shown in FIGS. 5-9 and described in further detail below. In certain exemplary embodiments, the user interface 230 displays to the user information about the resource utilization and/or performance of the target architecture. This information can be continuously (or substantially continuously (for example, every 2, 3, or other selected number of seconds)) updated and shown to the user as implementation constraints are modified, or alternative designs are explored, allowing the implementation decisions to be successively refined during the design process. In particular embodiments, the user can influence or direct which implementation method to use on a given operator instance via a flexible specification of desired characteristics (for example, by allowing the user to specify one or more implementation constraints as described above). Furthermore, the resource explorer component 212 (sometimes referred to as the "what-if" calculator) can be used to evaluate a set of proposed implementation methods and calculate their effect on one or more parameters of the target architecture. As noted above, the resource explorer can display the results of these calculations continuously or substantially continuously as modifications are made. For example, as the user selects implementation constraints, the resource explorer 212 can become active and calculate for the user the corresponding resource usages. For instance, in one particular implementation, the resource explorer 212 evaluates the overall resource utilization of the target architecture for a particular set of implementer assignments and updates the user interface 230 to show the impact of the user-proposed implementation, including for example, an indication of whether the resources of the target architecture might be overmapped. This evaluation can be performed, for example, by using information from the internal device library 220.

In certain embodiments, when a resource is overmapped (sometimes referred to as a "resource overmapped condition"), a resource allocator component 250 can be used to select alternative implementation methods. In one embodiment, the resource allocator component 250 is activated during synthesis (for example, at process block 114 of FIG. 1) and uses the implementation suggestor component 240 (through the resource manager 210) to automatically choose alternate implementations for one or more operator instances. Working with the resource allocator 240, once an acceptable set of implementers has been identified by the resource manager 210 for the intermediate RTL description, these implementaters can then be bound by the resource manager 210 for operator implementation at process block 116.

The implementation suggestor 240 illustrated in FIG. 2 interacts with the resource manager 210 and can be used to distribute and allocate the limited hardware resources on the target architecture (for example, the embedded DSPs, embedded memory blocks, dedicated multiplier blocks, and other such dedicated hardware components of the FPGA target architecture). A block diagram schematically illustrating the subcomponents of an exemplary implementation suggestor 240 is shown in FIG. 3.

In certain exemplary embodiments, the implementation suggestor 240 uses implementation constraints specified by the user (for example, specified via the user interface) along with heuristics to assign implementers to operator instances that were not specifically assigned by the user. In one exemplary embodiment, the objective of the implementation suggestor 240 is to achieve a desirable quality of results for the given device while still honoring user requirements. The desired quality of results may be that the design operate the fastest within the user-selected constraints, use the fewest resources of one or more types, or satisfy some other criteria.

The resource management graphical user interface 240 also enables the capability of an iterative design methodology. For example, the user may begin with a purely heuristic-based approach, wherein the resource manager 210 uses the implementation suggestor 240 to automatically choose all of the implementers for operator instances in the intermediate RTL description using stored heuristics, such as are well known in the art or that are determined experimentally using multiple benchmarking experiments with the target architectures across a variety of parameters. Subsequently, in some embodiments, after evaluating the resulting assignments against resource requirements (or, in some embodiments, against timing requirements) but before synthesis, the user may choose to specify different resource types and implementations for certain critical operators. Furthermore, the synthesis flow can be reentered and the implementer assignments modified (for example, to address resource, timing, or power requirements).

In one exemplary embodiment of the implementation suggestor 240, and as illustrated in FIG. 3, the implementation suggestor 240 operates through interactions through several other subcomponents. In the exemplary embodiment illustrated in FIG. 3, for example, the operation of the implementation suggestor 240 involves one or more of the following subcomponents: user control information 320 (typically provided by the resource manager 210), heuristics data 330, and operator information 310 (typically provided by the resource manager 210).

The operator information 310 refers to information received from the resource manager 210 about the operator in the corresponding operator instance that is to be assigned to an implementation method. The user control information 320 refers to information received from the resource manager 210 about whether and how the user provided any implementation constraints corresponding to the operator and can also include one or more global settings set by the user. For example, and as discussed above, the user control information may be provided in the form of implementation constraints selected from the user interface 230 or included in the RTL. As also explained above, and according to one exemplary embodiment, an implementation constraint typically indicates how the corresponding operator is to be implemented at one of multiple levels of specificity. For example, the implementation constraint may rule out certain implementers but still leave a set of two or more potential implementers for implementing a particular operator. Alternatively, the implementation constraint may specify exactly which implementer should be used for implementing an operator. The exemplary implementation suggestor 340 uses the heuristics data 330, the operator information 310, and the user control information 320 to provide instance specific assignments. The resulting assignments can then be stored by the resource manager 210.

In certain embodiments of the disclosed technology, the implementation suggestor 340 operates to suggest an implementer to the resource manager 210 for one or more operator instances in the intermediate RTL based at least in part on criteria provided in the user control information 320 and by the heuristics data 330. In general, the heuristics data 330 provided reflects the criteria that the implementation suggestor 340 uses when determining how to implement operator instances. The criteria for implementer selection can be based on area utilization (size criteria), and/or timing characteristics (speed criteria). These criteria should not be construed as limiting, however, as additional factors can also be considered.

In certain embodiments, these criteria can be affected by the user control information 320. For example, the implementation suggestor 340 can receive global settings in the user control information 320 and then retrieve heuristics data 330 based on the settings selected by the user. The heuristics data 330 typically includes priority lists of the implementers to use for each operator type for a given target architecture and across a variety of criteria. These lists can be based, for instance, on experimentation and quality of results benchmarking experiments previously performed to determine desirable implementations for a given operator instance across a variety of the criteria (for example, for multiple different operator size, area, or performance criteria). In certain embodiments, priority lists for untested combinations of criteria can be interpolated. The priority lists can be optionally updated from time to time to account for a user's preferences or past implementation habits.

In one exemplary embodiment, the priority list for a particular set of criteria are output to the implementation suggestor 340 on an instance-by-instance basis. Using this information, the implementation suggestor 340 can select an implementer for a given operator instance that suits the desired criteria. For example, based on the priority list from the heuristics data 330, and as further constrained by any implementation constraints provided by the user, the implementation suggestor 340 can provide a suggested implementer to the resource manager 210.

The following example illustrates an exemplary operation of the implementation suggestor 240. Consider a constant input multiplier, where the default criteria is not to use DSP or dedicated multipliers, since these tend to produce unfavorable delays up to a certain operator size. Thus, in this example, it is desirable to use the operator size as the criterion for selecting an implementation for a constant input multiplier because this criteria will generally result in a better frequency and circuit area. The implementation suggestor 240 can then use the operator size criteria to select an appropriate implementer for the given operator instance. Similar criteria can be used for other arithmetic operators.

According to one embodiment, the implementers suggested by the implementation suggestor 240 are allocated by the resource manager 210 for the corresponding operators. The assignments can be stored by the resource manager 210 in an intermediate database or data structure and the current resource utilization (and possibly other performance characteristics, such as timing) determined (for example, by the resource explorer 212).

Returning to FIG. 2, once the user is satisfied with a particular implementation (defined by the set of implementer assignments), the resource allocator 250 can then correct any overmapping problems in the set of implementer assignments, thereby resulting in a revised set of implementer assignments stored in the resource manager 210. For example, during synthesis and in the event that a particular resource is overmapped, the resource allocation engine can use the resource manager 210 to have the implementation suggestor 240 provide an implementation method that does not use the overmapped resource. For example, the resource allocation engine may provide a further constraint to the implementation suggestor 240 indicating that a particular resource is no longer available. In this way, the resource allocation engine can make the final decisions concerning the distribution and assignment of available resources in the target FPGA architecture.

After resource allocation, the resource manager 210 can bind the implementers to their respective operator instances, and an operator implementer can implement the operator instances in the design as bound by the resource manager 210. The remaining synthesis steps can then be performed to produce a gate-level netlist implementing the RTL.

C. A Design Example

The behavior of an exemplary embodiment of the framework can be demonstrated by using the following Verilog description of a basic m-bit by n-bit multiplier circuit:

```
module mult (A, B, C);
parameter m = 4;
parameter n = 6;
input [m-1:0] A;
input [n-1:0] B;
output [m+n-1:0] C;
assign C = A * B;
endmodule
```

This example was targeted to a Xilinx® Virtex-4® device available from Xilinx Corporation. By varying the actual values of the "m" and "n" parameters that define the input widths, a variety of different implementations were obtained from the implementation suggestor. Three different configurations were run through a resource management environment according to the exemplary framework illustrated in FIGS. 2 and 3, resulting in three different implementations. In this example, operator size was used as a primary selection criterion. Using data from benchmarking experiments performed with the Virtex-4® device, the heuristics data provided a ranking of possible implementers for the multiply circuit based on operator size. The implementer suggestor then suggested an implementer based on this ranking.

Figure 4A:
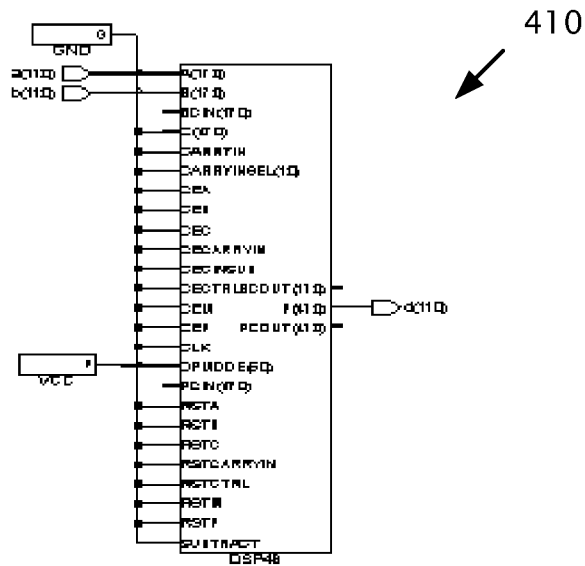
FIGS. 4A and 4C illustrate three different implementations as may be suggested by the implementation suggestor component of FIG. 3 for an exemplary multiplier circuit having inputs of varying bit size.
Figure 4B:
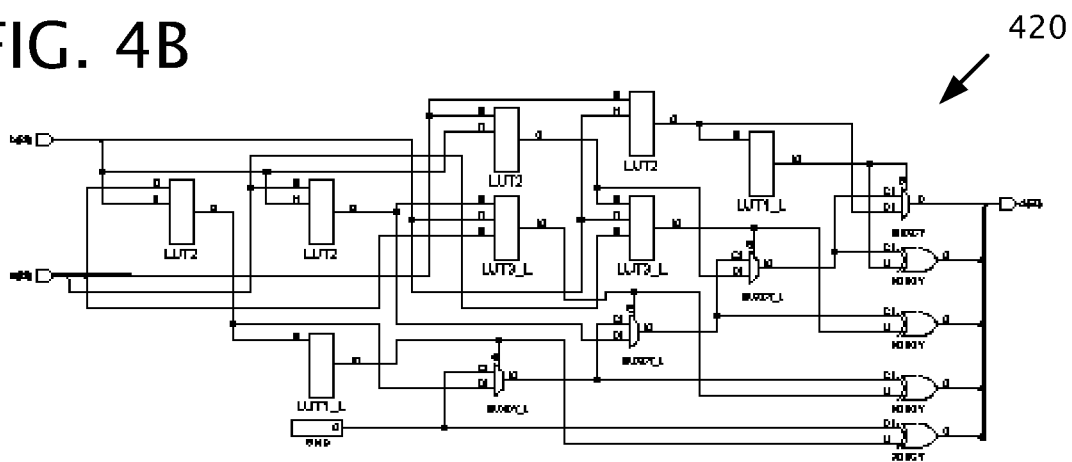
Figure 4C:
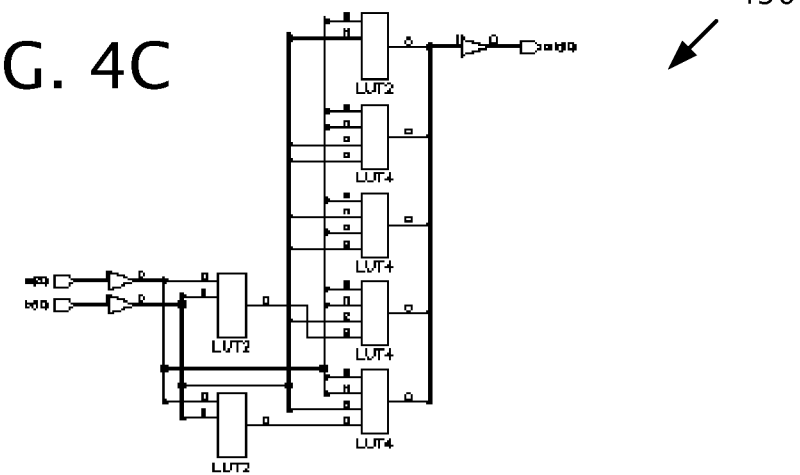

FIGS. 4A through 4C demonstrate the outcomes of varying the values of the "m" and "n" parameters. In particular, FIG. 4A illustrates an exemplary implementation 410 of the C=A*B operator when the A and B inputs were set to be twelve bits wide (m=n=12). An exemplary embodiment of the implementation suggestor found it most appropriate to map this operator to the Xilinx® ExtremeDSP slice (also known as DSP48) based on the significant size of the multiply operation. FIG. 4B illustrates an exemplary implementation 420 of the operator when the A and B inputs were set to be six bits wide (m=n=6). In this case, the exemplary implementation suggestor favored an implementation method using a combination of LUTs and high-speed carry chain cells. The carry chain, while incurring a small penalty to enter and exit, provides fast arithmetic logic. FIG. 4C illustrates an exemplary implementation 430 of the operator when the A input was set to be three bits wide and the B input was set to be two bits wide. In this case, the exemplary resource manager now considered a random logic implementation of only LUTs to be favorable, as the penalty of entering and exiting the carry chain was no longer worthwhile.

D. Exemplary Implementations of the Graphical User Interface

In this section, exemplary implementations of a graphical user interface as can be used as the graphical user interface 230 are illustrated and discussed. These exemplary implementations should not be construed as limiting in any way, as any of the principles and features performed by the illustrated implementations can be realized alone or in various combinations and subcombinations with one another using a variety of different user interface implementations. Moreover, additional information can be shown in the exemplary interfaces (for example, timing and power information for possible implementers, obtained for example from benchmarking experiments)

In certain embodiments, the graphical user interface is designed to provide a reporting mechanism to show the resource usage on the design. The graphical user interface can also function as a tool in which the user selects desired implementation assignments. For example, the graphical user interface can work in connection with the resource explorer 212 to provide an exploration environment in which a user can specify different implementations and see their effect on resource usage.

Figure 5:
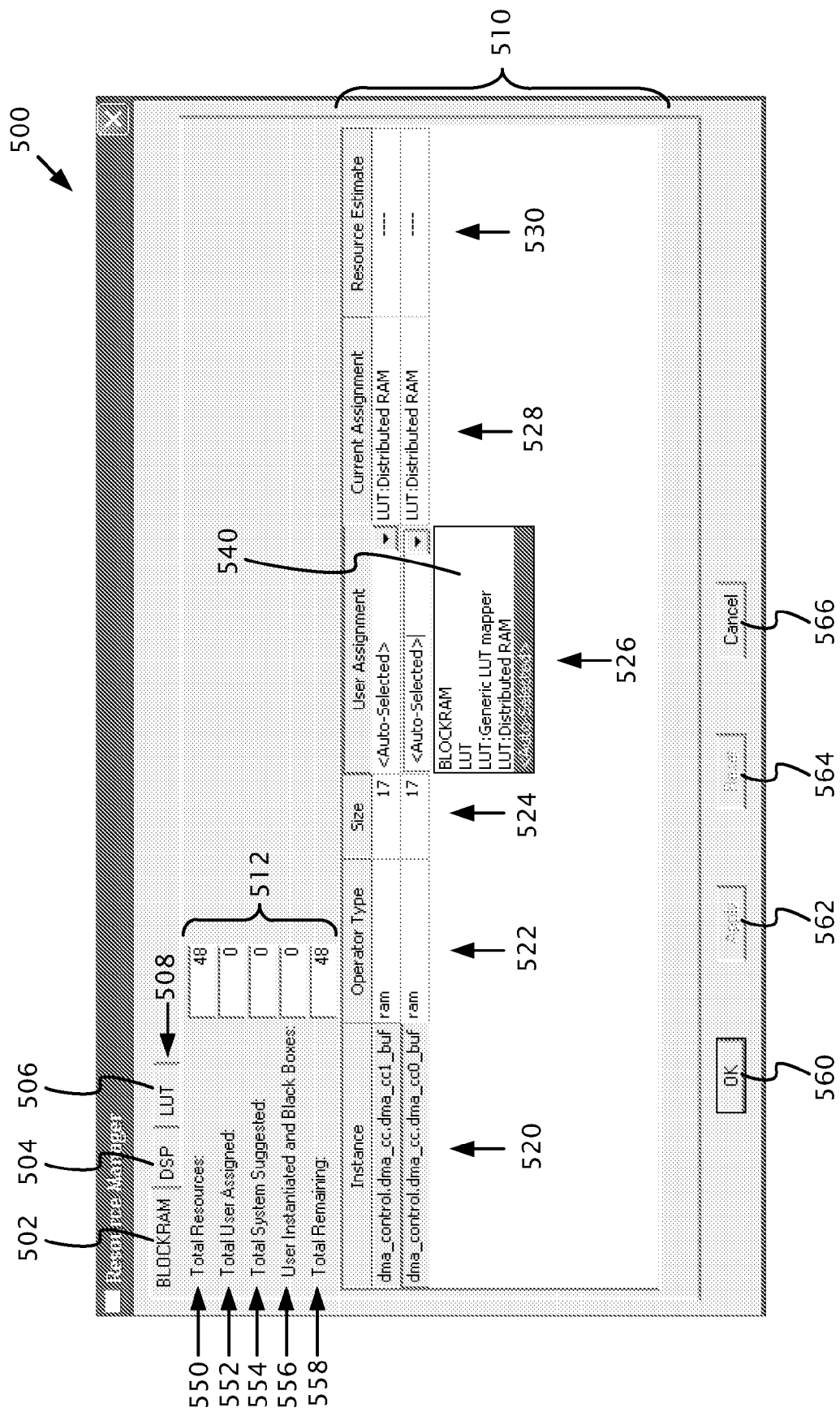
FIG. 5 is a first image of an exemplary graphical user interface as may be used in connection with the exemplary resource management framework of FIG. 2.

FIG. 5 is a first image 500 of an exemplary graphical user interface as may be used with any of the described embodiments. The exemplary user interface generally provides a view of one or more resource assignment windows, which represent one or more classes of available resources on the FPGA target architectures. For example, the exemplary user interface 500 provides three different resource assignment windows: a BLOCKRAM window 502, a DSP window 504, and a LUT window 506. These different resource assignment windows can be selected by selecting the appropriate window tab 508. Thus, in FIG. 5, the BLOCKRAM window is selected and displayed to the user. For each resource window, the exemplary embodiments includes a main display 510 and a resource usage display 512, which indicates one or more values related to resource usage in the circuit design being synthesized.

In FIG. 5, the exemplary resource usage display 512 provides information about the usage of BLOCKRAM resources on the target architecture according to the user's current set of implementer assignments. In the exemplary display 512, multiple items of information indicative of how BLOCKRAM resources are currently used are provided. A "total resources" entry 550 indicates the total available resource for the FPGA architecture currently being targeted. This information can be obtained, for instance, from the internal device library 220. Further, the available resources can be manually constrained by the user where the user wishes to provide only a limited budget of certain resources during the design process. For example, if multiple designers are working together to implement a design, each may be allocated a different number of available resources. Thus, in the illustrated example, the exemplary entry 550 indicates that there are 48 available BLOCKRAM resources on the target architecture. A "total user assigned" entry 552 indicates the estimated usage resulting from user assignments. The example entry 522 indicates that no BLOCKRAM resources are currently assigned. A "total system suggested" entry 554 indicates the estimated usage resulting from assignments that are selected automatically. A "user instantiated and black boxes" entry 556 indicates the number of instantiated elements and further includes the number of resources budgeted by a user for use with one or more black box models. For example, one or more portions of the final design may not be included in the RTL being synthesized (for example, portions not yet created) or may be encrypted (for example, encrypted IP) such that they cannot be synthesized using normal procedures. In such situations, the user can reserve a fixed amount of resources to ensure that these portions of the design can be implemented. Such allocations are termed "black box" allocations. A "total remaining" entry 558 indicates the current estimated number of unused elements remaining after synthesis is completed.

In FIG. 5, the main window 510 is organized in a spreadsheet-like manner. In the main window 510, a number of columns and rows appear. In the illustrated implementation, an "instance" column 520 lists a number of operator instances from the intermediate RTL. An "operator" column 522 provides a description of the type of operator described by the corresponding operator instance. The operator type is typically extracted by the synthesis tool by analyzing the circuit description. A "size" column 524 indicates the operator size of the corresponding operator instance. The size can be indicated, for example, in terms of data bit width. A "user assignment" column 526 indicates an optional user specified implementation constraint for the corresponding operator instance. In certain embodiments, if the user does not specify an implementation constraint, then a default selection of "auto-selected" is made, indicating that the assignment is to be made automatically by the implementation suggestor 340 or resource allocator 250. To allow the user to make a user assignment by specifying an implementation constraint, a pull-down window presenting the available implementation constraint choices to the user can be implemented. For example, a pull-down window such as exemplary pull-down window 540 can be provided.

As seen in the exemplary pull-down window 540, the available choices of implementation constraints for the RAM operator for the "dma_control.dma_cc.dma_ccl_buf" operator instance are "BLOCKRAM" (indicating the use of an embedded memory block resource on the target architecture), "LUT" (indicating the use of a LUT resource on the target architecture), "LUT:Generic LUT mapper (indicating the use of a LUT resource as mapped by a LUT mapper), "LUT: Distributed RAM" (indicating the use of a LUT configured as distributed RAM), and "<Auto-Selected>" (indicating that the selection is to be made automatically).

The choices provided in the pull-down window can correspond to the implementation constraints (as described above) and can therefore provide different levels of specificity. For example, according to one exemplary implementation, the different levels includes: a resource type, an implementation style, and a specific operator implementer. By providing different levels of specificity, the user may select a more general indication of how a particular operator should be implemented generic to FPGA architectures manufactured by different vendors, or can provide a more specific indication that is particular to the target FPGA architecture being considered. The main window 510 further includes a "current assignment" column 528 indicating the current implementer assignment for the corresponding operator instance. A resource estimate column 530 indicates the current estimated resource usage, based on the current resource assignment for the corresponding operator instance. The estimated resource usage for a given operator assigned to an implementation method is typically based on characteristics of the operator instance, the device resource characteristics, and the behavioral modelling of the implementation method. For instance, the resource usage can be determined by implementing the instance virtually using the current implementer assignment or by built-in intelligence in the prediction mechanism based on the behavior of the implementation method. For example, given a multiplier instance which has 10-bit-wide inputs A and B, and which is to be implemented using embedded DSP blocks, then the implementation method would use an estimated 1 DSP block if the available DSP blocks support 10-by-10-bit-wide multiplication.

In the illustrated embodiment, because each of the two operator instances shown are assigned to LUT resources (more specifically, to LUTs configured as distributed RAM), the estimated resource usage for each is 0 (indicated by "----"). For this same reason, the resource usage display 512 indicates that no BLOCKRAM resources are currently assigned by the user (indicated by the total user assigned entry 552) or by the system (indicated by the total system suggested entry 554). Thus, all of the available resources (indicated by the total resources entry 550) are still available (indicated by the total remaining entry 558).

In the illustrated implementation, a user can choose the implementation constraints for any of the displayed operator instances and the information in the resource usage display 512 can be automatically updated (for example, in real time). If the user is unsatisfied with the results of the assignments, a "reset" button 564 can be selected to effectively undo the set of assignments previously applied. The user can also commit to current assignments to the database by selecting an "OK" button 560 (which commits the current assignments and closes the graphical user interface) or an "Apply" button 562 (which commits the current assignments but does not close the graphical user interface). By doing this, however, the user will no longer be able to undo the changes by selecting the "reset" button 564. Furthermore, in the exemplary implementation, the user can discard all modified user assignments and close the graphical user interface by selecting a "cancel" button 566.

In the illustrated implementation, the resource usage information is computed by the resource explorer 212 using knowledge of the assignments selected by the user via the user interface 230, the implementations selected by the implementation suggestor 240, and knowledge of the target architecture obtained from the internal device library 220. This computation, however, does not require actual synthesis into a gate-level netlist to occur and can be performed as the intermediate RTL is manipulated by the resource manager 210. Thus, the computation can be performed quickly and efficiently, allowing the user to explore a variety of different possible implementations without having to perform the time-consuming task of actually producing a gate-level netlist.

Figure 6:
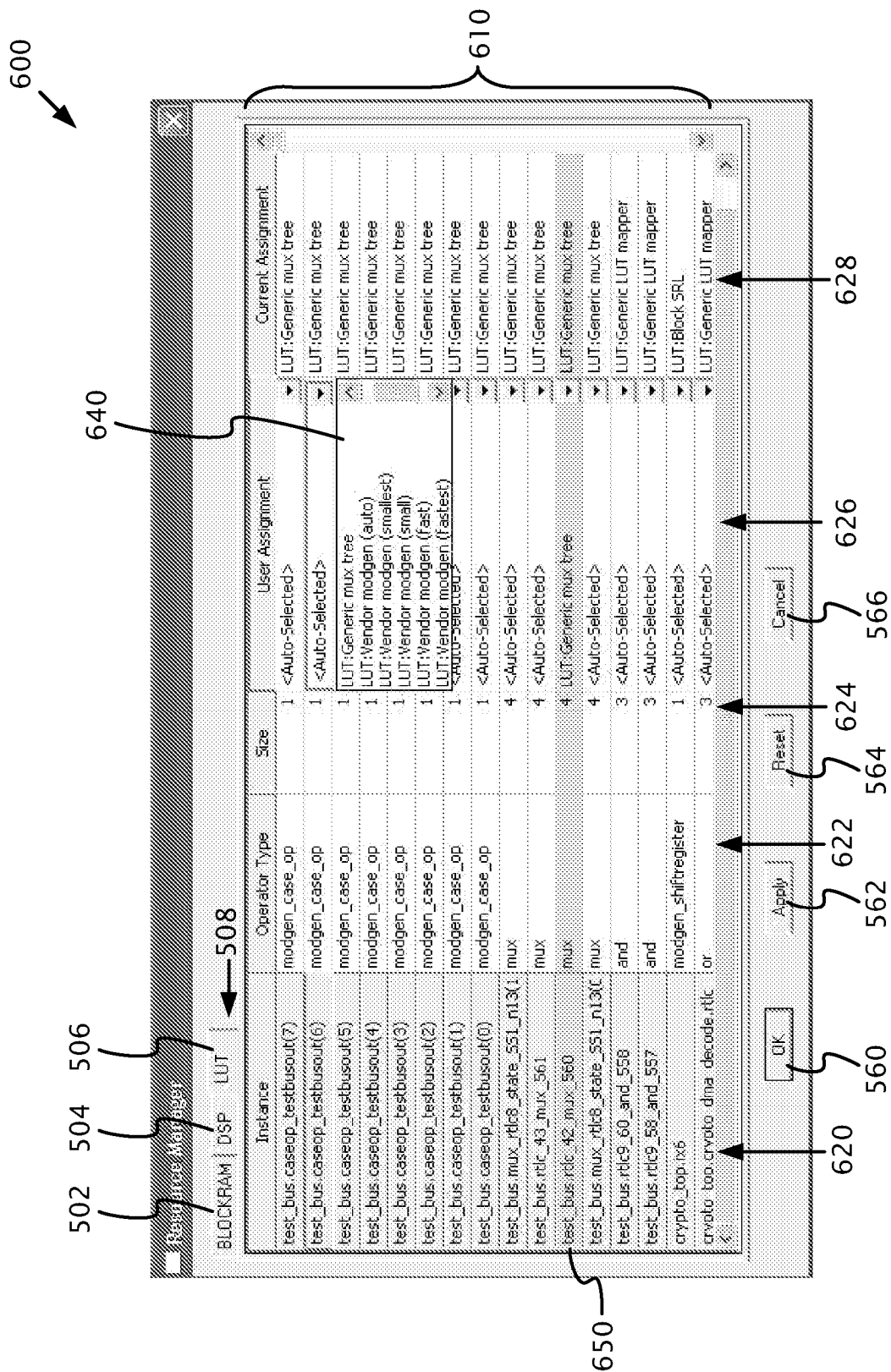
FIG. 6 is a second image of an exemplary graphical user interface as may be used in connection with the exemplary resource management framework of FIG. 2.

FIG. 6 is an image 600 of an exemplary implementation of the LUT window 506. As with the exemplary BLOCKRAM window 502 described above, the exemplary LUT window 506 includes a main display 610 that includes an instance column 620, an operator type column 622, a size column 624, a user assignment column 626, and a current assignment column 628. Note, however, that the exemplary LUT display 610 does not include a resource estimate column or a resource usage display. In the illustrated embodiment, LUT resource usage is not accounted for, though in other embodiments, LUT usage could be accounted for in a manner substantially similar to the BLOCKRAM accounting described above.

In the illustrated embodiment, an exemplary pull-down window 640 indicates the available implementation constraint choices for implementing the case optimization operator "test_bus.caseop_testbusout(6)." In particular, the available choices illustrated include implementing the operator using a LUT configured in a generic tree configuration or using one of the available module generation implementers from the vendor, which are configured to achieve a certain desirable characteristic (such as speed or size). Note also that additional choices are available, but are not shown with the window sized as illustrated in FIG. 6. The additional choices can be viewed in the exemplary embodiment by scrolling through the pull-down window 640 using the scroll bar on the window.

As seen in FIG. 6, and according to one exemplary implementation, when an operator instance is assigned by a user as in exemplary entry 650, the corresponding row of the user interface can become highlighted or otherwise include some indication distinguishing it from other entries in the main display 610.

Figure 7:
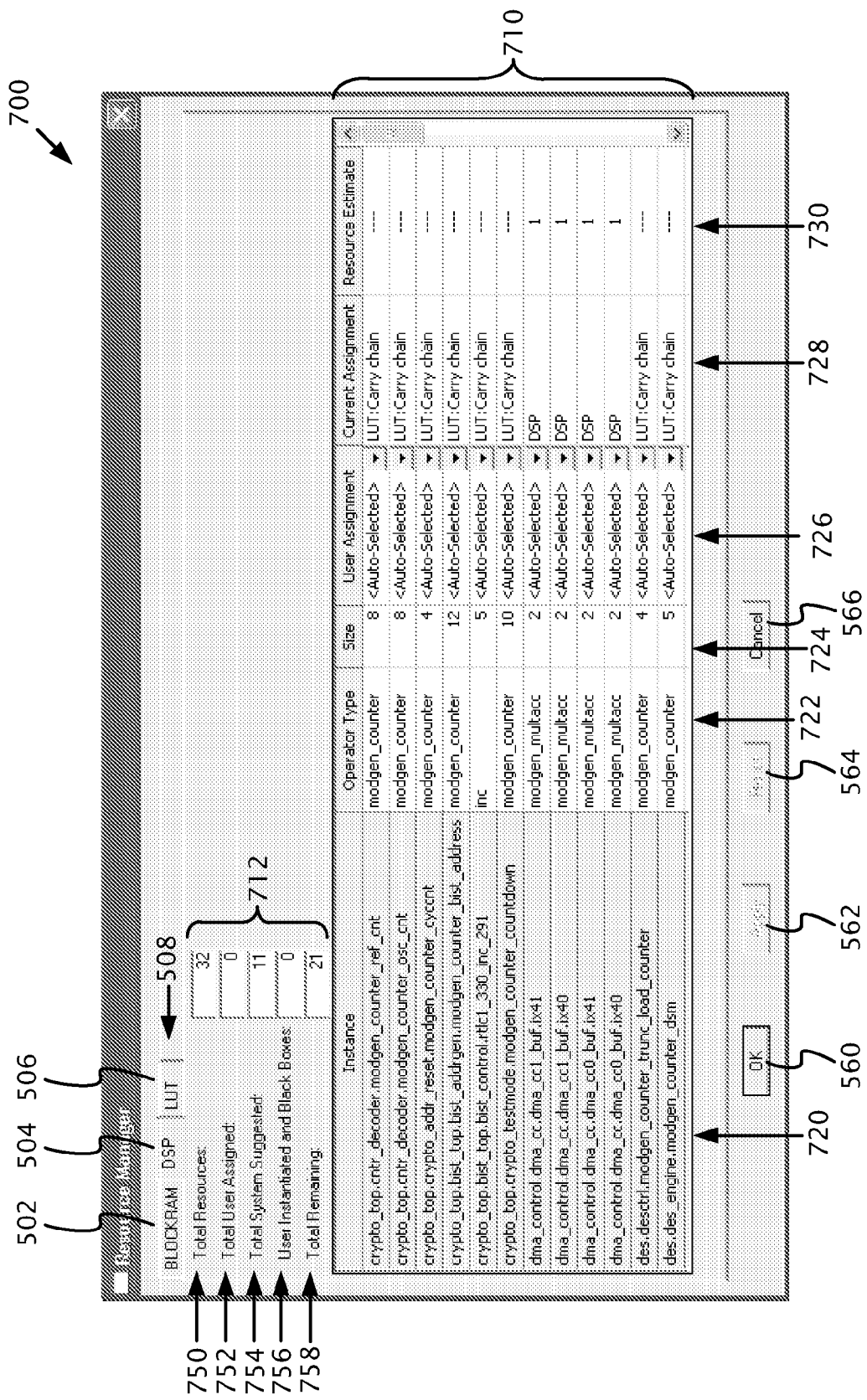
FIG. 7 is a third image of an exemplary graphical user interface as may be used in connection with the exemplary resource management framework of FIG. 2.

FIG. 7 is an image 700 of an exemplary implementation of the DSP window 504. As with the exemplary BLOCKRAM window 502 described above, the exemplary DSP window 504 includes a main display 710 that includes an instance column 720, an operator type column 722, a size column 724, a user assignment column 726, a current assignment column 728, and a resource estimate column 730. In the exemplary implementation, the DSP window 504 also includes a resource usage display 712 as in FIG. 5 with a total resources entry 750, a total user assigned entry 752, a total system suggested entry 754, a user instantiated and black boxes entry 756, and a total remaining entry 758.

The particular image 700 shown in FIG. 7 illustrates a situation where the user has not specified any implementation constraints. Instead, all of the operator instance assignments have been made based on heuristic-based suggestions made by the implementation suggestor 240. As can be seen in the current assignment column 728, a number of the operator instances (in particular, those defining multiply accumulator operators) in the main display 710 have been assigned to embedded DSP blocks. Because of the limited size of the main display 710, many operator instances are not shown in FIG. 7, but can be viewed by the user using the scroll bar associated with the main display 710.

In this example, and as seen in the resource usage display 712, a total of 32 embedded DSP blocks are available in the target architecture under consideration (indicated by the total resource entry 750), of which 11 have been assigned automatically by the resource allocator (indicated by the total system suggested entry 754), leaving 21 embedded DSP blocks (indicated by the total remaining entry 758).

Figure 8:
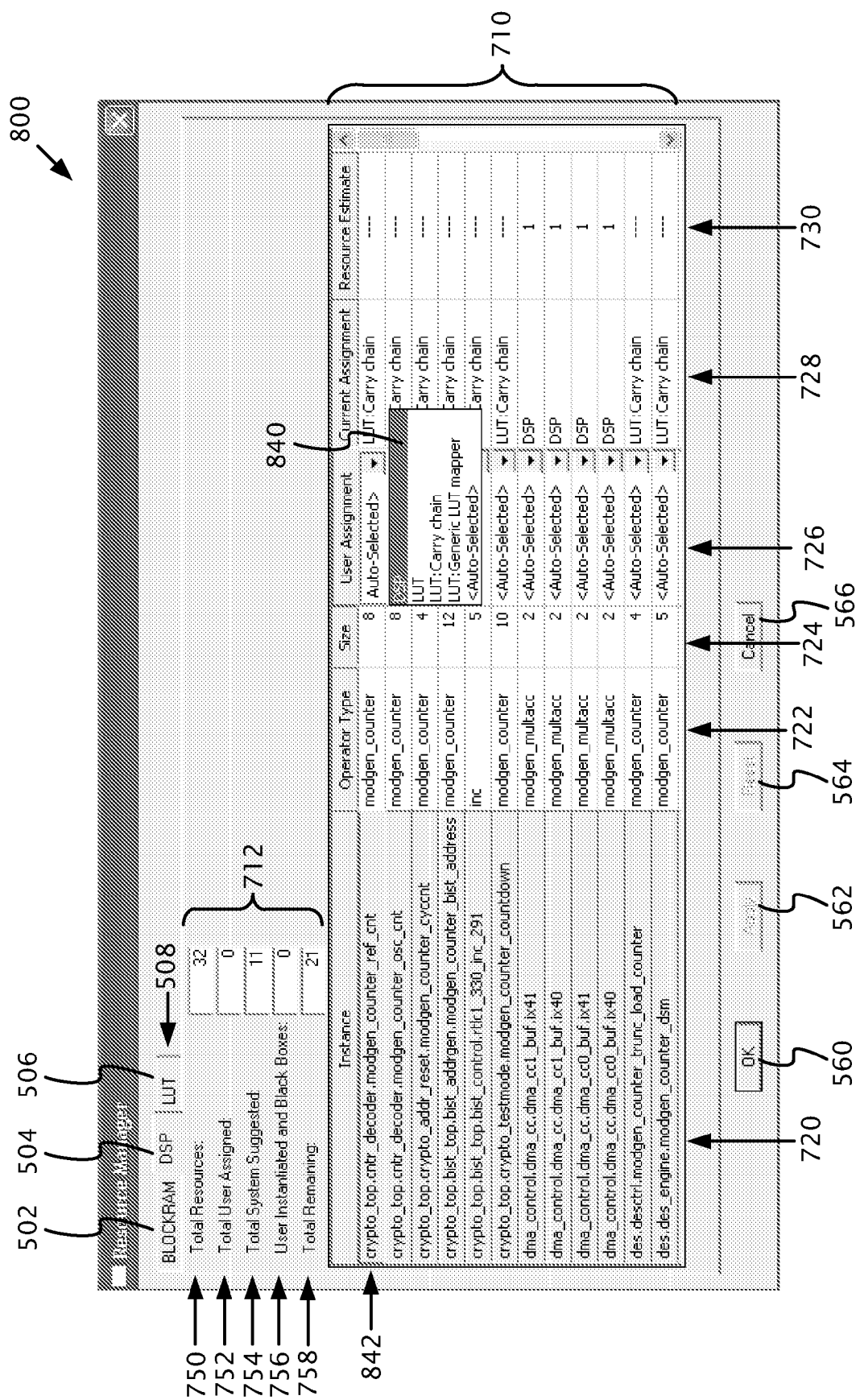
FIG. 8 is a fourth image of an exemplary graphical user interface as may be used in connection with the exemplary resource management framework of FIG. 2.

FIG. 8 is an image 800 of the exemplary DSP window 504 of FIG. 7, after a user has selected a pull-down window 840 associated with entry 842 for the "crypto_top.cntr_decoder.modgen_counter_ref_cnt" operator instance. As can be seen in the exemplary pull-down window 840, a number of the operator instances (in particular, those defining multiply accumulator operators) in the main display 710 have been assigned to embedded DSP blocks.

Figure 9:
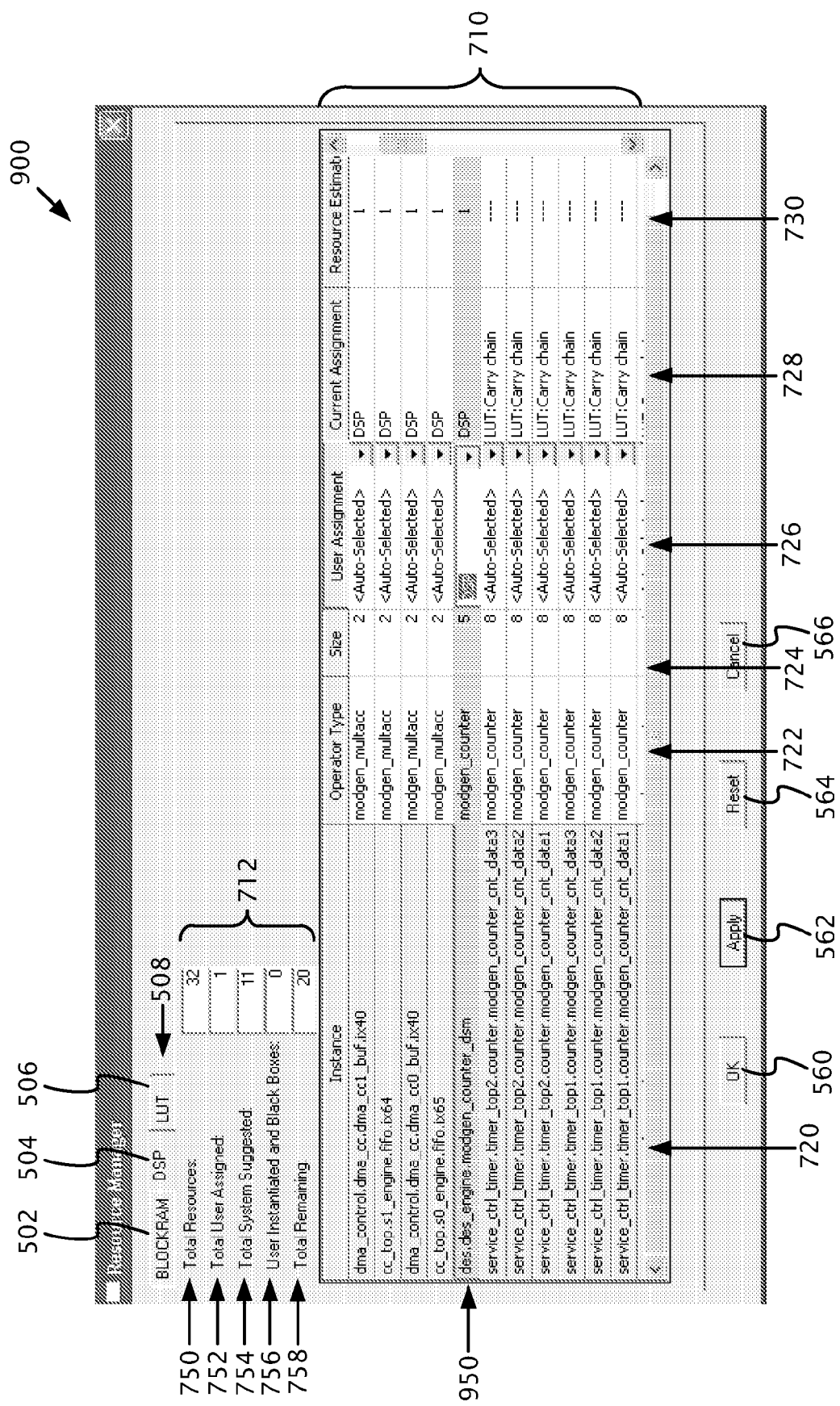
FIG. 9 is a fifth image of an exemplary graphical user interface as may be used in connection with the exemplary resource management framework of FIG. 2.

FIG. 9 is an image 900 of the exemplary DSP window 504 of FIG. 7, after a user has selected an operator instance entry 950 and specified via an implementation constraint that the operator instance be implemented using embedded DSP blocks. The user's selection is shown, for example, in the corresponding user assignment column 726.

Consequently, and as seen in the resource usage display 712, a total of 32 embedded DSP blocks are available in the target architecture under consideration (indicated by the total resource entry 550), of which 1 has now been assigned by the user (indicated by the total user assigned entry 752), 11 have been suggested automatically by the implementation suggestor (indicated by the total system suggested entry 754), leaving 20 remaining embedded DSP blocks (indicated by the total remaining entry 758).

The above-described implementations should not be construed as limiting, as graphical user interfaces according to the disclosed technology can display the desired information in a variety of manners. Furthermore, in certain embodiments, additional information can be displayed to the user. For example, in embodiments that account for timing and power in the resource assignment procedure, an estimated delay and/or power of a particular implementer can be displayed in the graphical user interface (for example, next to the respective implementer if it is shown in a pull-down menu of a user assignment column or in a timing estimate column or area estimate column once the implementer is assigned).

V. Exemplary Network Environments for Applying the Disclosed Techniques

Figure 10:
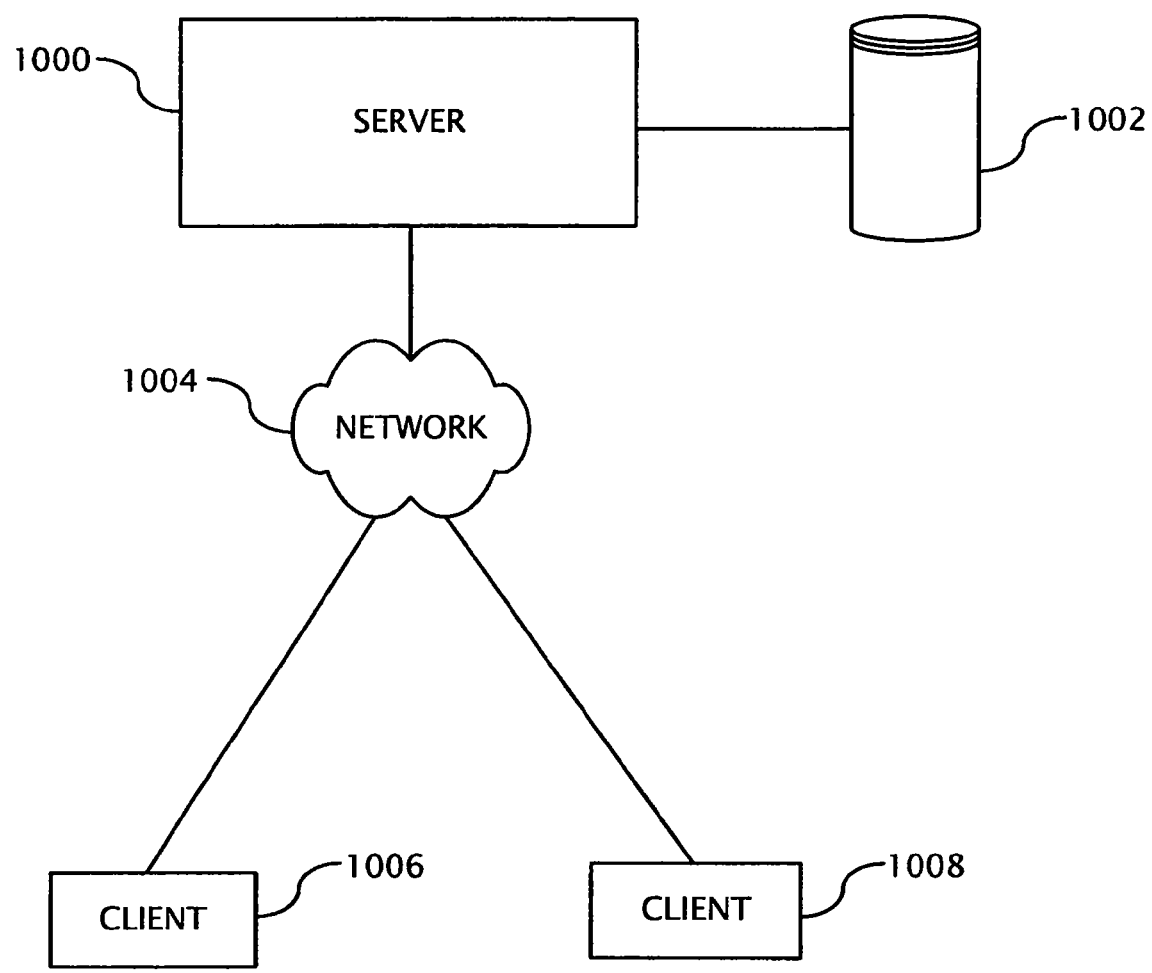
FIG. 10 is a schematic block diagram of a network as may be used to perform any of the disclosed methods.

Any of the aspects of the technology described above may be performed using a distributed computer network. FIG. 10 shows one such exemplary network. A server computer 1000 can have an associated storage device 1002 (internal or external to the server computer). For example, the server computer 1000 can be configured to perform a resource management technique according to any of the disclosed embodiments (for example, as part of an EDA software tool, such as an RTL synthesis tool). The server computer 1000 can be coupled to a network, shown generally at 1004, which can comprise, for example, a wide-area network, a local-area network, a client-server network, the Internet, or other such network. One or more client computers, such as those shown at 1006, 1008, may be coupled to the network 1004 using a network protocol. The work may also be performed on a single, dedicated workstation, which has its own memory and one or more CPUs.

Figure 11:
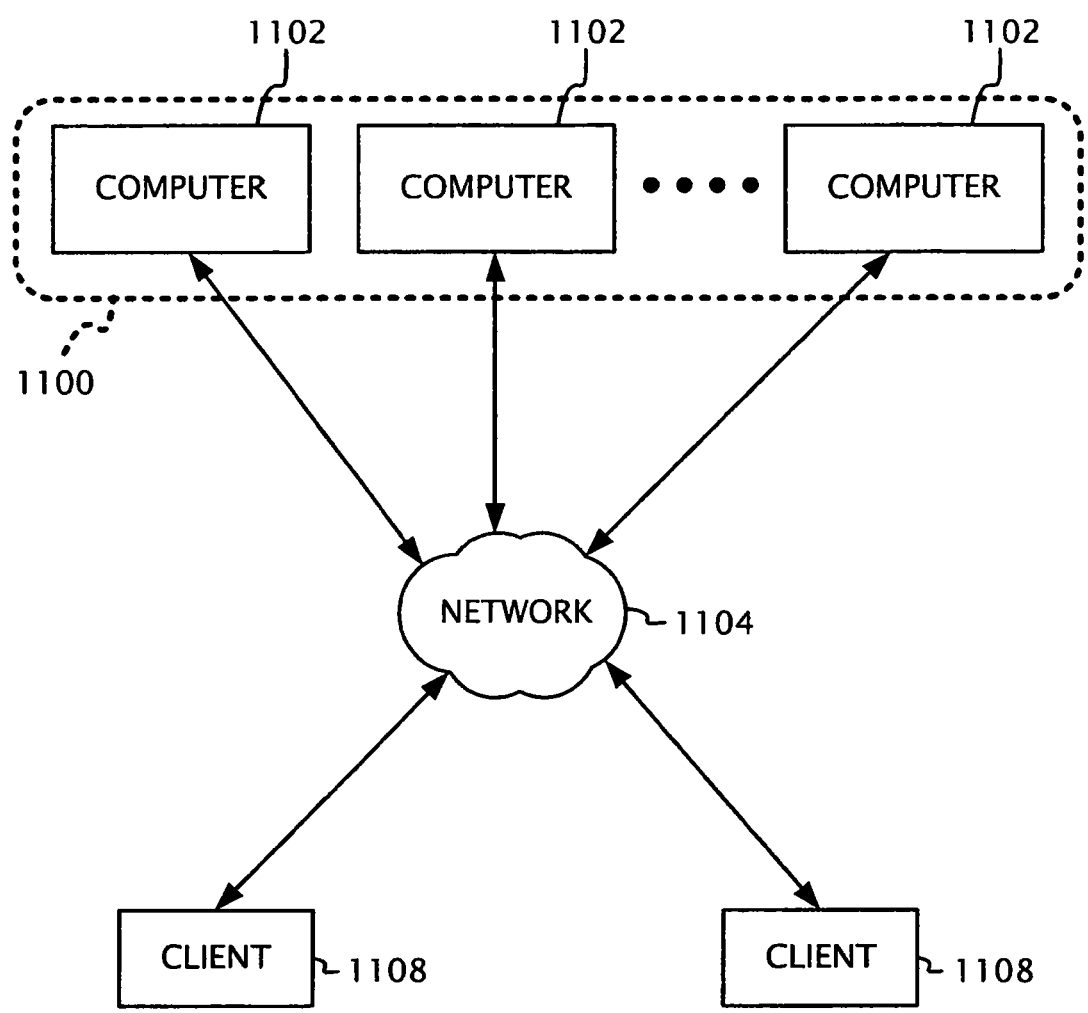
FIG. 11 is a schematic block diagram of a distributed computing network as may be used to perform any of the disclosed methods.

FIG. 11 shows another exemplary network. One or more computers 1102 communicate via a network 1104 and form a computing environment 1100 (for example, a distributed computing environment). Each of the computers 1102 in the computing environment 1100 can be used to perform at least a portion of the resource allocation technique according to any of the disclosed embodiments (for example, as part of an EDA software tool, such as an RTL synthesis tool). The network 1104 in the illustrated embodiment is also coupled to one or more client computers 1108.

Figure 12:
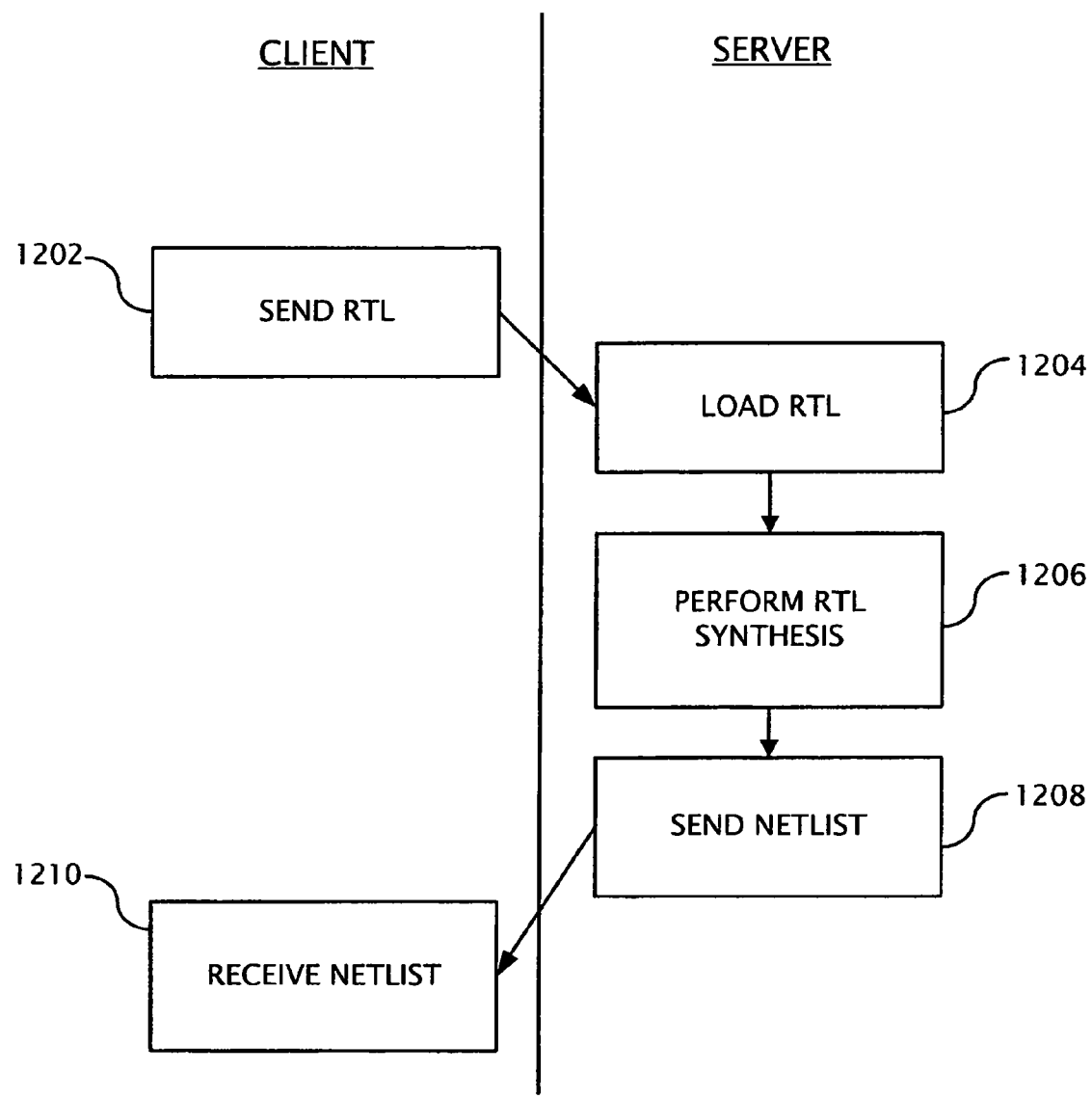
FIG. 12 is a flowchart illustrating how RTL synthesis using any of the disclosed techniques can be performed in the network of FIG. 10 or FIG. 11.

FIG. 12 shows that an RTL circuit description (for example, a VHDL, Verilog, or other such RTL file indicative of a circuit design) can be analyzed using a remote server computer (such as the server computer 1000 shown in FIG. 10) or a remote computing environment (such as the computing environment 1100 shown in FIG. 11) in order to perform RTL synthesis using any of the embodiments disclosed herein. At process block 1202, for example, the client computer sends the RTL description to the remote server or computing environment. In process block 1204, the RTL description is received and loaded by the remote server or by respective components of the remote computing environment. In process block 1206, RTL synthesis is performed using any of the disclosed embodiments. At process block 1208, the remote server or computing environment sends the resulting gate-level netlist to the client computer, which receives the data at process block 1210. It should be apparent to those skilled in the art that the example shown in FIG. 12 is not the only way to perform RTL synthesis using multiple computers. For instance, the RTL description may be stored on a computer-readable medium that is not on a network and that is sent separately to the server or computing environment (for example, a CD-ROM, DVD, or portable hard drive). Or, the server computer or remote computing environment may perform only a portion of the RTL synthesis procedures.

The disclosed approaches may be modified to consider architecture or device specific issues such as routing resource. For example, when architecture is routing limited, the most efficient usage of dedicated resources may often lead to excessively congested routing. This may negatively impact performance by forcing detour routes on critical signals; or, in some cases, result in a design that cannot be routed. Therefore, and according to certain exemplary embodiments, a criterion can be added for selecting an implementation that takes predicted routing and congestion into consideration.

As programmable logic devices continue to differentiate and add new specialized blocks the number of choices for implementer options will increase. The resource manager framework of the disclosed technology is extensible and can easily accommodate additional resource types and implementers.

Having illustrated and described the principles of the illustrated embodiments, it will be apparent to those skilled in the art that the embodiments can be modified in arrangement and detail without departing from such principles. For example, any of the disclosed embodiments can be used to perform synthesis from a gate-level netlist that includes one or more operators that can be discerned (for example, operators that were not dissolved during the synthesis process). Operator instances can be implied from the preserved operators, and post-synthesis optimization can performed using any of the RTL synthesis procedures described herein. Furthermore, any of the disclosed embodiments can also be used to perform RTL synthesis for designs to be implemented on a plurality of FPGAs. Furthermore, in certain embodiments, operator instances are grouped together in the graphical user interface for the purpose of applying implementation constraints. For instance, operator instances that perform similar operations or that are otherwise related in the RTL can be grouped together so that they are implemented according to the same implementation constraint selected by the user. The groupings can be automatically determined or user selected. Further, in certain embodiments, the information available in the graphical user interface can be made available to other graphical user interfaces associated with the synthesis process. This functionality is sometimes referred to as "crossprobing" and enables a user to navigate from a piece of information in one visualization method to the same or related information in another visualization method.

In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. One or more non-transitory computer-readable media storing computer-executable instructions thereon, which, when executed by a computer, cause the computer to perform a method for performing register-transfer-level ("RTL") synthesis in a computer-implemented synthesis tool, the method comprising:
    receiving an RTL description of a circuit to be implemented in a target architecture, wherein the target architecture comprises a previously fabricated architecture having a limited number of hardware resources available in a class of hardware resources;
    determining assignment information indicative of how operator instances in the RTL description are to be implemented on the previously fabricated architecture using the hardware resources in the class of hardware resources; and
    displaying to a user at least some of the determined assignment information indicative of how operator instances in the RTL description are to be implemented using the hardware resources in the class of hardware resources.

2. The one or more non-transitory computer-readable media of claim 1, wherein the class of hardware resources is a first class of hardware resources, and wherein the method further comprises:
    modifying the assignment information such that at least one of the operator instances is to be implemented using hardware resources in a second class of hardware resources;
    calculating how many of the hardware resources in the first class of hardware resources have been assigned after the modification; and
    displaying an updated indication of the total number of hardware resources in the first class that are remaining after accounting for current assignments.

3. The one or more non-transitory computer-readable media of claim 1, wherein the displaying to the user the at least some of the determined assignment information comprises:
    displaying to the user one or more of a total number of hardware resources in the class that have been assigned using a user-selected implementation constraint, displaying to the user a total number of hardware resources in the class that have been assigned without using a user-selected implementation constraint, or displaying to the user a total number of hardware resources in the class that are remaining after accounting for current assignments, wherein the displaying is performed prior to a gate-level netlist being generated according to the assignment information.

4. The one or more non-transitory computer-readable media of claim 1, wherein the method further comprises displaying an indication that the hardware resources in the class of hardware resources have been overmapped.

5. The one or more non-transitory computer-readable media of claim 1, wherein the previously fabricated architecture comprises one or more field programmable gate arrays ("FPGAs").

6. The one or more non-transitory computer-readable media of claim 1, wherein the class of hardware resources comprises embedded memory blocks, embedded multiplier blocks, embedded DSP blocks, or logic fabric.

7. One or more non-transitory computer-readable media storing computer-executable instructions thereon, which, when executed by a computer, cause the computer to perform a method for register-transfer-level ("RTL") synthesis in a computer-implemented synthesis tool, the method comprising:
    receiving an RTL description of a circuit to be implemented in a target architecture, wherein the target architecture is a programmable logic device comprising a fixed number of available hardware resources in a class of hardware resources;
    determining one or more operator instances from the RTL description received, at least some of the one or more operator instances being implementable by the hardware resources in the class of hardware resources; and
    displaying to a user an indication of the one or more operator instances implementable by the hardware resources in the class of hardware resources.

8. The one or more non-transitory computer-readable media of claim 7, wherein the displaying is performed prior to initially synthesizing the RTL description into a gate-level netlist.

9. The one or more non-transitory computer-readable media of claim 7, the method further comprising displaying an indication of the number of the hardware resources available in the class of hardware resources.

10. The one or more non-transitory computer-readable media of claim 7, the method further comprising:
    assigning at least one of the operator instances to be implemented using at least one of the hardware resources in the class of hardware resources;
    calculating how many of the hardware resources have been assigned; and displaying an indication of the number of the hardware resources assigned.

11. The one or more non-transitory computer-readable media of claim 10, wherein the assigning is performed in accordance with an implementation constraint selected by the user.

12. The one or more non-transitory computer-readable media of claim 7, wherein the method further comprises displaying an indication of a number of the hardware resources in the class of hardware resources to which operator instances have not been assigned.

13. One or more non-transitory computer-readable media storing computer-executable instructions thereon, which, when executed by a computer, cause the computer to perform a method for performing synthesis in a register-transfer-level ("RTL") synthesis tool, the method comprising:

receiving an RTL description of a circuit to be implemented in a target architecture having a limited number of available hardware resources, wherein the target architecture comprises at least one field programmable gate array ("FPGA");

determining a plurality of operator instances from the RTL description received, the plurality of operator instances being implementable by one or more of the hardware resources available in the target architecture; and providing a graphical user interface that displays to a user one or more of the operator instances and allows the user to associate an implementation constraint with at least one of the operator instances, the implementation constraint being selectable from a list of one or more implementation constraints known to be usable for the at least one of the operator instances, and the implementation constraint being indicative of one or more types of hardware resources to be used in implementing the associated at least one of the operator instances.

14. The one or more non-transitory computer-readable media of claim 13, wherein the implementation constraint indicates that an associated operator instance is to be implemented in the target architecture using one of a set of one or more implementation methods, the set of one or more implementation methods consisting of a subset of all implementation methods available for implementing the associated operator instance in the target architecture.

15. The one or more non-transitory computer-readable media of claim 13, wherein the method further comprises producing a gate-level netlist implementing operator instances in accordance with one or more associated implementation constraints.

16. The one or more non-transitory computer-readable media of claim 13, wherein the graphical user interface displays an associated timing delay or resource usage cost for the implementation constraint.

17. The one or more non-transitory computer-readable media of claim 13, the method further comprising:

assigning the operator instances to respective hardware resources available in the target architecture; and displaying in the graphical user interface information about resource usage in the target architecture resulting from the assignment, wherein the displaying is performed before a gate-level netlist is generated from the assignment.

18. The one or more non-transitory computer-readable media of claim 17, wherein the information about resource usage includes one or more of a total number of hardware resources available in the target architecture in a class of hardware resources, a total number of hardware resources in the class that have been assigned using a user-selected implementation constraint, a total number of hardware resources in the class that have been assigned without using a user-selected implementation constraint, or a total number of resources in the class that are remaining after accounting for the assignment.

19. One or more non-transitory computer-readable media storing computer-executable instructions thereon, which, when executed by a computer, cause the computer to perform a method for performing register-transfer-level ("RTL") synthesis in a computer-implemented synthesis tool, the method comprising:

receiving an RTL description of a circuit to be implemented in a target architecture, wherein the target architecture comprises a known architecture having a fixed number of programmable hardware resources in a class of programmable hardware resources;

determining one or more operator instances from the RTL description received, at least some of the one or more operator instances being implementable by the programmable hardware resources in the class of programmable hardware resources; and prior to initially synthesizing the RTL description into a gate-level netlist, automatically determining assignment information indicative of how the operator instances are to be implemented using the programmable hardware resources in the class of programmable hardware resources and providing a graphical user interface that allows a user to view and modify the assignment information.

20. The one or more non-transitory computer-readable media of claim 19, the method further comprising displaying in the graphical user interface one or more of a total number of programmable hardware resources available in the target architecture in the class of programmable hardware resources, a total number of programmable hardware resources in the class that have been assigned using a user-selected implementation constraint, a total number of programmable hardware resources in the class that have been automatically assigned without using a user-selected implementation constraint, or a total number of programmable resources in the class that are remaining after accounting for the assignment information.

* * * * *